United States Patent
Naganuma et al.

[11] Patent Number: 5,917,729
[45] Date of Patent: Jun. 29, 1999

[54] METHOD OF AND APPARATUS FOR PLACING AND ROUTING ELEMENTS OF SEMICONDUCTOR INTEGRATED CIRCUIT HAVING REDUCED DELAY TIME

[75] Inventors: Masayuki Naganuma; Tetsu Tanizawa, both of Kawasaki, Japan

[73] Assignee: Fujitsu Limited, Kawasaki, Japan

[21] Appl. No.: 08/964,318

[22] Filed: Nov. 4, 1997

Related U.S. Application Data

[63] Continuation of application No. 08/406,404, Mar. 20, 1995, abandoned.

[30] Foreign Application Priority Data

May 19, 1994 [JP] Japan .................................. 6-105457

[51] Int. Cl.[6] .................................................. G06F 17/50
[52] U.S. Cl. ................................. 364/491; 364/490
[58] Field of Search ................... 364/433–491, 364/578

[56] References Cited

U.S. PATENT DOCUMENTS

| | | | |
|---|---|---|---|
| 4,554,625 | 11/1985 | Otten ........................................ | 364/148 |
| 5,339,253 | 8/1994 | Carrig et al. ............................. | 364/489 |
| 5,399,517 | 3/1995 | Ashtaputre et al. ....................... | 437/51 |
| 5,410,491 | 4/1995 | Minami .................................... | 364/491 |
| 5,452,239 | 9/1995 | Wei-Jin et al. .......................... | 364/578 |
| 5,493,510 | 2/1996 | Shikata .................................... | 364/491 |

OTHER PUBLICATIONS

Swinnen et al. ("Timing issues related to the automated placement and routing of high performance ASICs", IEEE, Proceedings of the Fourth Annual IEEE International ASIC Conference and Exhibit, Sep. 23, 1991).

Brasen et al. ("MHERTZ: a new optimization algorithm for floorplanning and global routing", IEEE, 27th ACM/IEEE Design Automation Conference, Jun. 24, 1990).

Chao et al. ("Zero skew clock routing with minimum wirelength", IEEE Transactions on Circuits and Systems II: Analog and Digital Signal Processing, vol. 39, No. 11, pp. 799–814, Nov. 1992).

Ramanathan et al. ("Clock distribution in general VLSI circuits", IEEE Transactions on Circuits and Systems I: Fundamental Theory and Applications, vol. 41, No. 5, pp. 395–404, May 1994).

Chao et al. ("Zero skew clock net routing", IEEE Comput. Soc. Press, Proceedings of the 29th ACM/IEEE Design Automation Conference, Jun. 8, 1992, pp. 518–523).

Groeneveld ("A multiple layer contour-based gridless channel router", IEEE Transactions on Computer-Aided Design of Integrated Circuits and Systems, vol. 9, No. 12, pp. 1278–1288, Dec. 1990).

(List continued on next page.)

*Primary Examiner*—Kevin J. Teska
*Assistant Examiner*—Phallaka Kik
*Attorney, Agent, or Firm*—Nikaido, Marmelstein, Murray & Oram LLP

[57] ABSTRACT

A method of placing and routing elements of a semiconductor integrated circuit picks out a signal net, a driver of the signal net, and load cells driven by the driver among the elements of the integrated circuit, places the driver at a first position, defines a first range based on the first position, determines a second position in the first range, defines a second range based on the second position, and collectively places the load cells of a predetermined number in the second range. Namely, the method deals with a signal net in the integrated circuit, a driver of the net, and load cells driven by the driver. The method sets conditions on the signal net, driver, and load cells, when placing and routing the elements of the integrated circuit, to thereby reduce skew (skew time), wiring overhead, and time delay in the integrated circuit and speedily and easily place and route the elements.

28 Claims, 24 Drawing Sheets

OTHER PUBLICATIONS

"Basic Concepts of Timing–Oriented Design Automation for High–Performance Mainframe Computers", Terai et al, 28th ACM/IEEE Design Automation Conference, Jun. 17, 1991, pp. 193–198.

"A 300K–Circuit ASIC Logic Family CAD System", Panner et al, IEEE 1990 Custom Integrated Circuits Conference, May 13, 1990, pp. 10.4.1–10.4.5.

"Clock Skew Reduction Approach for Standard Cell", Saigo et al, IEEE 1990 Custom Integrated Circuits Conference, May 13, 1990, pp. 16.4.1–16.4.4.

Fig.12

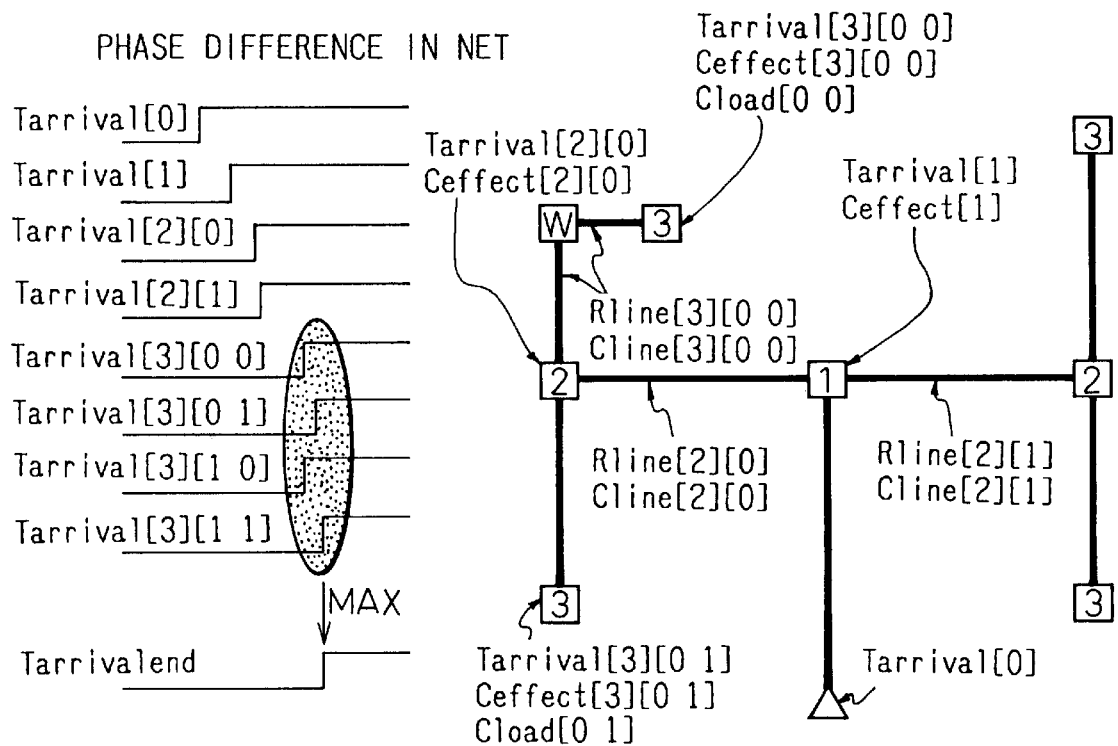

ARRIVAL TIME AT TERMINAL
Tarrivalend=MAX(Tarrival[n])    n = 3

Tarrival[3][i j]=Rline[3][i j]×(Ceffect[3][i j]
        +Cline[3][i j]/2)+Tarrival[2][i]
Tarrival[2][i]  =Rline[2][i]×(Ceffect[2][i]
        +Cline[2][i]/2)+Tarrival[1]
Tarrival[1]    =Rline[1]×(Ceffect[1]
        +Cline[1]/2)+Tarrival Ceffect[3][i j]=Cload[i j]
Ceffect[2][i]  =Σ(j, Cline[3][i j])+Σ(j, Ceffect[3][i j])
Ceffect[1]    =Σ(i, Cline[2][i])+Σ(i, Ceffect[2][i])

n: DEPTH OF TREE i, j: THE NUMBERS OF BRANCHES

Rline[n] AND Cline[n] ARE CALCULATED FROM LINE LENGTH BETWEEN BRANCHES, OR BETWEEN BRANCH AND TERMINAL

Fig. 23
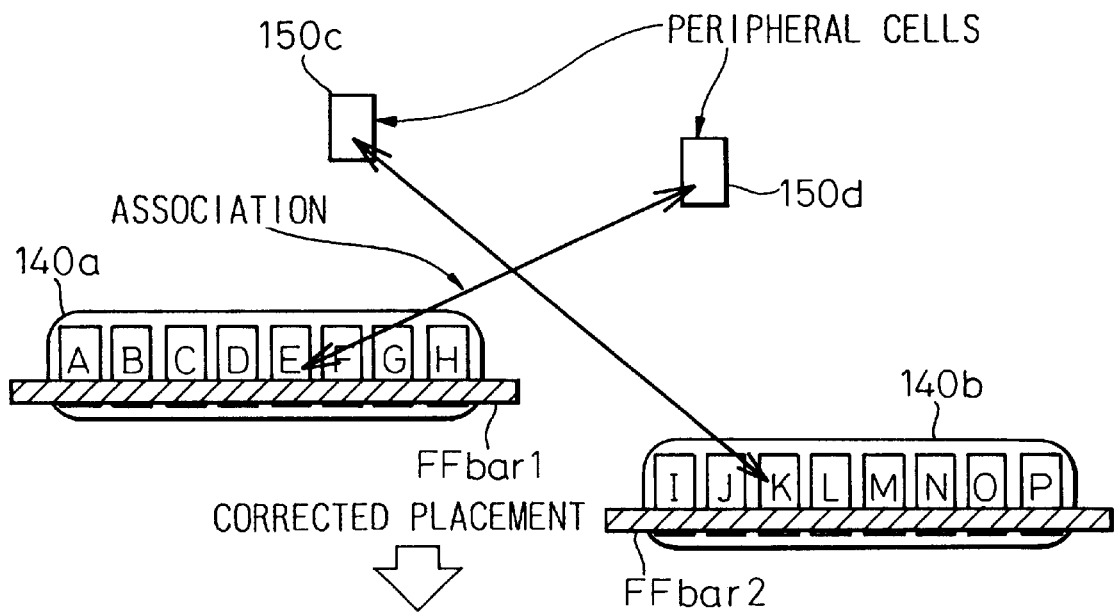
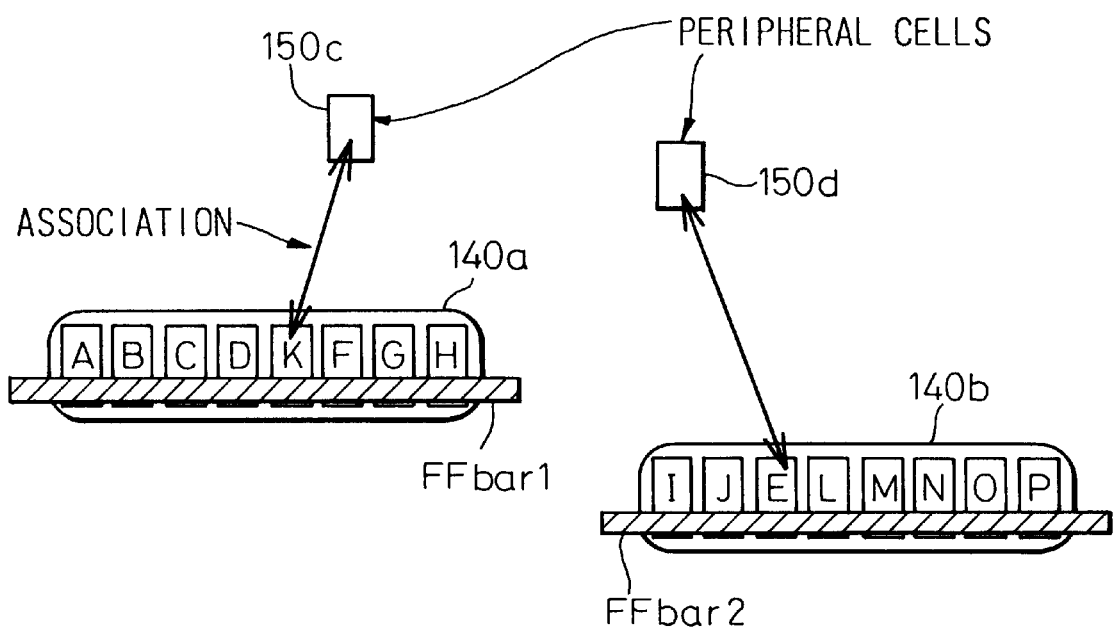

METHOD OF AND APPARATUS FOR PLACING AND ROUTING ELEMENTS OF SEMICONDUCTOR INTEGRATED CIRCUIT HAVING REDUCED DELAY TIME

This application is a continuation of application Ser. No. 08/406,404 filed Mar. 20, 1995 now abandoned.

BACKGROUND OF THE INVENTION

1. Field of the Invention

The present invention relates to a method of and an apparatus for placing and routing elements of a semiconductor integrated circuit, and more particularly, to a method of and an apparatus for placing and routing elements of a semiconductor integrated circuit with the use of a computer.

2. Description of the Related Art

A computer aided design (CAD) system is used to design a semiconductor integrated circuit (IC). This system requires a method of and an apparatus for speedily and easily placing and routing elements of the IC while reducing skew (skew time), wiring overhead, and propagation delay times in the IC.

The prior art adopted for CAD systems first prepares a net list involving various cells, and then routes the cells. This technique is insufficient in various points. Concretely, in the prior art, a time dependent layout technique for placing and routing elements of a semiconductor IC is provided.

For example, in this prior art time dependent layout technique, a very long time is required to complete the placing and routing of a semiconductor IC. Note that the prior art suppresses skew by adjusting load capacitance and by employing balanced wiring, snaking wiring, and star wiring. In addition, the prior art must secure a margin of space to suppress skew. This reduces an available area for logic circuits.

Further, the prior art must artificially induce delays at a high speed terminal (fast terminal) relative to a terminal (slow terminal) that receives a signal behind the high speed terminal, to suppress skew. This increases the overall time delay in producing the IC. An IC production operation usually involves temporal fluctuations due to variations in temperature, processes, and source voltages. These fluctuations affect time delay in the IC. The prior art, therefore, must consider a margin for absorbing such fluctuations.

SUMMARY OF THE INVENTION

An object of the present invention is to provide a method of and an apparatus for speedily and easily placing and routing elements of a semiconductor IC while reducing skew (skew time), wiring overhead, and a wiring area in the IC as well as propagation delay times and power consumption of the IC.

According to the present invention, there is provided a method of placing and routing elements of a semiconductor integrated circuit, comprising the steps of picking out a signal net, a driver unit of the signal net, and load cells driven by the driver unit among the elements of the integrated circuit; placing the driver unit at a first position, defining a first range based on the first position; fixing a second position in the first range; defining a second range based on the second position, and collectively placing and routing the load cells of predetermined number in the second range.

The first range may be the whole of a first area around the first position, or a range between a first area around the first position and a second area defined in the first area. The method may include the steps of preparing a plurality of second positions and routing the first position to the plurality of second positions through star wiring. The signal net may be a clock signal net, the driver unit is a clock driver, and the load cells may be flip-flops.

The method may include the step of placing the load cells in a reserved area of predetermined size. The method may include the step of placing the load cells along a reserved line of predetermined length. The method may include the step of placing the load cells along the reserved line with clock terminals of the load cells being positioned along the reserved line, so that the capacitance of a line from a branch point to any one of the load cells may be determined by the length of the line.

The method may include the step of placing the load cells along the reserved line side by side such that short sides of each load cell are in parallel with the reserved line. The method may include the step of placing the load cells like a spine with the reserved line serving as a base line. The method may include the step of replacing load cells on the same reserved line with each other according to associations with respect to peripheral cells. The method may include the step of replacing load cells on different reserved lines with each other according to associations with respect to peripheral cells.

The method may include the step of placing reserved lines in an area that satisfies a target skew with respect to a driver cell. The method may include the step of connecting the reserved lines to the driver cell through star wiring with the driver cell serving as a root. The method may include the step of connecting equipotential output terminals of the driver cell to the reserved lines, respectively.

Further, according to the present invention, there is provided an apparatus for placing and routing elements of a semiconductor integrated circuit, having an input unit for entering data, a storage unit for storing data, a processor for placing and routing the elements of the integrated circuit according to data from the input unit and the storage unit, and a display unit for displaying images according to data provided by the processor, wherein the apparatus comprises a unit for picking out a signal net, a driver of the signal net, and load cells connected to the driver among the elements of the integrated circuit; a unit for placing the driver at a first position; a unit for defining a first range based on the first position, fixing a second position in the first range, and defining a second range based on the second position; and a unit for collectively placing and routing the load cells of predetermined number in the second range.

The storage unit may comprise a unit for storing logic circuit information such as a net list; a unit for storing routing attribute information to identify clocks and signals; a unit for storing resource information such as information about the elements of the integrated circuit; and a unit for storing programs such as sequences of processes. The first range may be the whole of a first area around the first position. The first range may be a range between a first area around the first position and a second area defined in the first area.

A plurality of second positions may be defined, and the first position may be connected to the plurality of second positions through star wiring. The signal net may be a clock signal net, and the load cells may be flip-flops. The load cells may be placed in a reserved area of predetermined size. The load cells may be placed along a reserved line of predetermined length.

The load cells may be placed along the reserved line with the clock terminals of the load cells being positioned along the reserved line, so that the capacitance of a line from a branch point to any one of the load cells may be determined by the length of the line. The load cells may be placed along the reserved line side by side such that short sides of each load cell are in parallel with the reserved line. The load cells may be placed like a spine with the reserved line serving as a base line.

Load cells on the same reserved line may be replaced with each other according to associations with respect to peripheral cells. Load cells on different reserved lines may be replaced with each other according to associations with respect to peripheral cells. Reserved lines may be placed in an area that satisfies a target skew with respect to the driver cell. The reserved lines may be connected to the driver cell through star wiring with the driver cell serving as a root. The driver cell may have output terminals of the same potential, which are connected to the reserved lines, respectively.

According to the present invention, there is also provided a semiconductor integrated circuit, characterized in that a signal net and load cells connected to the signal net are picked out from elements of the integrated circuit, and that the load cells are placed and routed in a reserved area of predetermined size.

The signal net may be a clock signal net, and the load cells may be flip-flops. The load cells may be placed along a reserved line of predetermined length. A branch point may be defined in a first range around a position of a clock buffer, and the load cells of predetermined number may be collectively placed in a second range that is defined according to the branch point.

The load cells may be placed such that clock terminals of the load cells are arranged along the reserved line. The load cells may be placed along the reserved line side by side such that the short sides of each load cell are in parallel with the reserved line. The load cells may be placed like a spine with the reserved line serving as a base line.

A plurality of reserved lines may be placed in an area that satisfies a target skew with respect to the driver cell. The reserved lines may be connected to the driver cell through star wiring with the driver cell serving as a root. The driver cell may have output terminals of the same potential, which are connected to the reserved lines, respectively.

According to the present invention, there is provided a method of placing and routing elements of a semiconductor integrated circuit by picking out a signal net from the elements of the integrated circuit and routing the signal net, wherein the method comprises the step of extending or shortening end lines if one end line is extended or shortened.

The method may include the step of extending or shortening end lines in response to a change in a capacitance or resistance of a line.

Further, according to the present invention, there is provided a method of placing and routing elements of a semiconductor integrated circuit by picking out a signal net from the elements of the integrated circuit and routing the signal net, wherein the method comprises the step of branching an end line if another end line is branched.

The signal net may be a clock signal net. The method may include the step of routing the signal net along a reserved area. The method may include the step of calculating arrival time at each predetermined position in the signal net.

The method may include the step of determining a width of each line in the signal net so as to minimize the arrival time calculated at each predetermined position. The method may include the step of displaying the calculated arrival time in the vicinity of each predetermined position on a screen that displays the signal net. The predetermined positions in the signal net may include branch points and end points of the signal net.

According to the present invention, there is also provided an apparatus for placing and routing elements of a semiconductor integrated circuit, having an input unit for entering data, a storage unit for storing data, a processor for placing and routing the elements of the integrated circuit according to data from the input unit and the storage unit, and a display unit for displaying images according to data provided by the processor, wherein the apparatus comprises a unit for picking out a signal net among the elements of the integrated circuit; a unit for extending or shortening one of end lines when routing the signal net; and a unit for extending or shortening the other end lines in response to the extension or shortening of the end line.

The end lines may be extended or shortened in response to a change in a capacitance or resistance of a line.

In addition, according to the present invention, there is provided an apparatus for placing and routing elements of a semiconductor integrated circuit, having an input unit for entering data, a storage unit for storing data, a processor for placing and routing the elements of the integrated circuit according to data from the input unit and the storage unit, and a display unit for displaying images according to data provided by the processor, wherein the apparatus comprises a unit for picking out a signal net among the elements of the integrated circuit; a unit for branching one of end lines when routing the signal net; and a unit for branching another end line in response to the branching of the end line.

The storage unit may comprise a unit for storing logic circuit information such as a net list; a unit for storing routing attribute information to identify clocks and signals; a unit for storing resource information such as information about the elements of the integrated circuit, and a unit for storing programs such as sequences of processes. The signal net may be a clock signal net. The signal net may be routed along a reserved area.

An arrival time at a predetermined position in the signal net may be calculated. A width of each line in the signal net may be determined to minimize the arrival time calculated at each predetermined position. The calculated arrival time may be displayed in the vicinity of each predetermined position on a screen that displays the signal net. The predetermined positions in the signal net may include branch points and end points of the signal net.

BRIEF DESCRIPTION OF THE DRAWINGS

The present invention will be more clearly understood from the description of the preferred embodiments as set forth below with reference to the accompanying drawings, wherein:

FIG. 12 shows calculations of arrival time of a signal according to the first aspect of the present invention;

FIG. 23 shows an improvement in an arrangement of blocks of target cells according to the second aspect of the present invention;

DESCRIPTION OF THE PREFERRED EMBODIMENTS

For a better understanding of the preferred embodiments of the present invention, the problems of a prior art will be explained.

A CAD system is used to place and route elements of a master slice semiconductor IC such as a gate array and a standard cell. The prior art adopted for the CAD system first prepares a net list involving various cells and then routes the cells. This technique is insufficient in various points.

Figure 1:
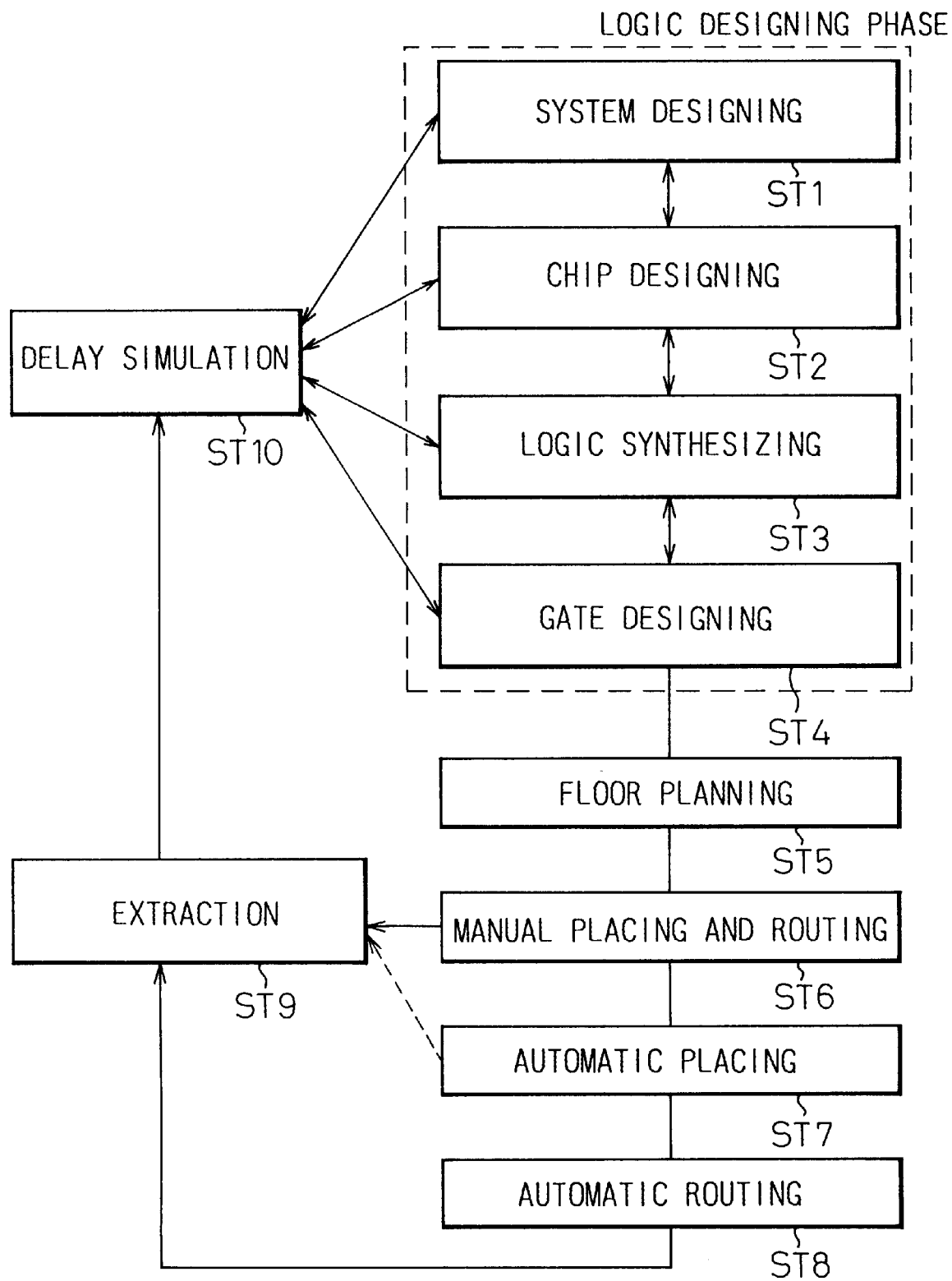
FIG. 1 is a flowchart showing the steps of placing and routing elements of a semiconductor IC according to a prior art.

FIG. 1 is a flowchart showing the steps of placing and routing elements of a semiconductor IC according to the prior art. This is called a Timing Driven Layout technique.

Step ST1 designs a system or a board. Step ST2 designs chips or blocks. Step ST3 logically synthesizes each block, or manually designs each block. Step ST4 designs gates, or prepares a net list. The steps ST1 to ST4 are in a logic design phase.

Step ST5 places I/O cells, RAMs, multipliers, etc., determines the sizes and positions of blocks, roughly places and routes gates, and tests the degree of congestion, which is called as a floor plan in this specification. Step ST6 manually places and routes some elements. Step ST7 automatically places elements, and step ST8 automatically routes the elements.

Step ST9 extracts a given cell out of the IC, i.e., a chip whose elements have been placed and routed. Step ST10 calculates a delay in the arrival time of a signal and simulates the operation of the chip. The delay time and simulation results provided by the step ST9 are fed back to the steps ST1 to ST4 to repeat these steps. The extraction process in the step ST9 is also carried out in the steps ST6 and ST7.

The Timing Driven Layout technique must repeat these steps, for example, three times, and it takes about one month, until the step ST8 first carries out the automatic routing process. Accordingly, the prior art takes a very long time to complete the placing and routing of a semiconductor IC.

The prior art suppresses skew by adjusting load capacitance and by employing balanced wiring, snaking wiring, and star wiring. In addition, the prior art must secure a margin space to suppress skew. This reduces the available area for logic circuits. The prior art must prolong delay at a fast terminal relative to a slow terminal that receives a signal behind the fast terminal, to suppress skew. This increases propagation delay times in the IC as a whole. An IC operation usually involves temporal fluctuations due to variations in temperature, processes, and source voltages. These fluctuations affect time delay in the IC. The prior art, therefore, must consider a time margin (waste time) for absorbing such fluctuations.

Figure 2:
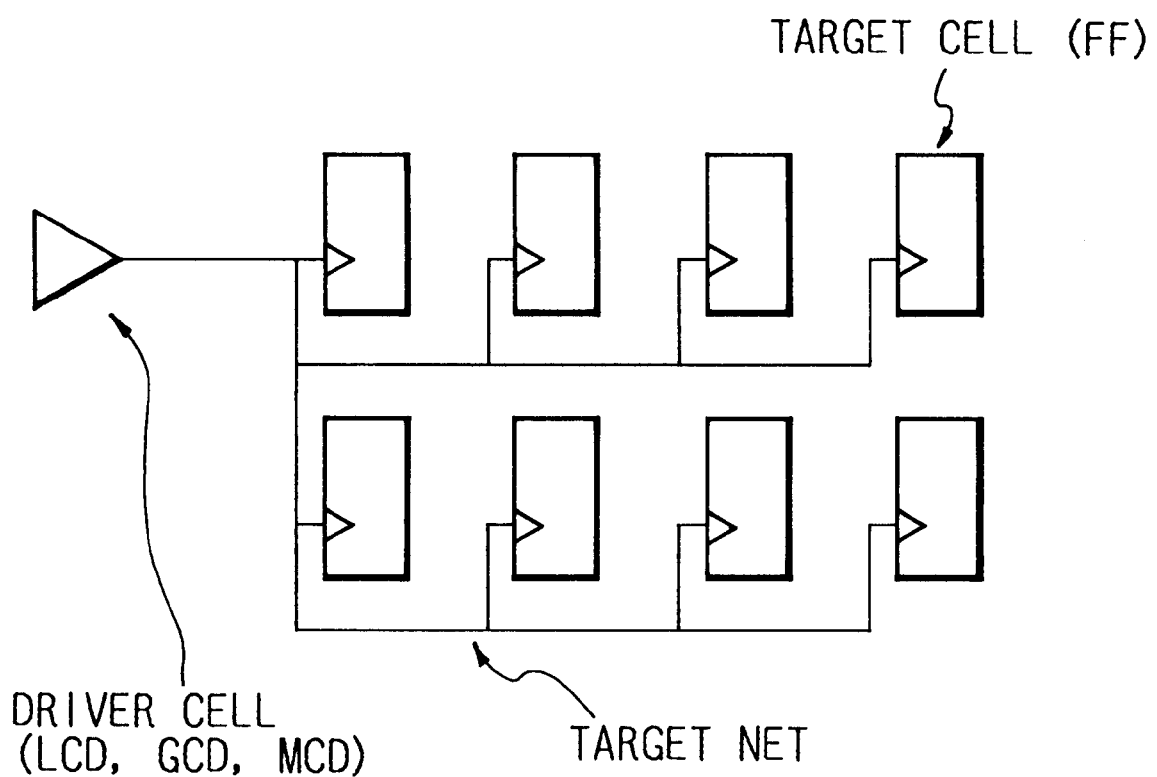
FIG. 2 explains the principle of a method of placing and routing elements of a semiconductor IC according to the present invention.

The principle of a method of placing and routing elements of a semiconductor IC according to the present invention will be explained next with reference to FIG. 2.

The present invention deals with, among elements of the IC, a signal net, a driver of the net, and load cells (flip-flops) driven by the driver. The present invention places the driver at a first position, sets a first range (area) based on the first position, determines a second position in the first range, fixes a second range based on the second position, and collectively arranges the load cells in the second range.

In an example, the signal net is a clock signal net, the driver is a clock driver or a clock buffer, and the load cells are flip-flops.

In this way, the present invention picks out a signal net, a driver or a clock buffer of the net, and load cells connected to the net among elements of a semiconductor IC. The present invention places the driver at a first position, sets a first range based on the first position, determines a second position in the first range, fixes a second range based on the second position, and collectively arranges the load cells in the second range.

The present invention speedily and easily places and routes elements of a semiconductor IC while minimizing skew (skew time), wiring overhead, and propagation delay times in the IC.

Methods and apparatuses for placing and routing elements of a semiconductor IC according to the embodiments of the present invention will be explained next with reference to the drawings.

FIGS. 3 to 5 and 14 to 18 show examples of images displayed by a CAD system employing the method of the present invention. FIGS. 6 to 13 explain the first aspect of the present invention shown in FIGS. 3 to 5. FIGS. 19 to 28 explain the second aspect of the present invention shown in FIGS. 14 to 18.

Figure 3:
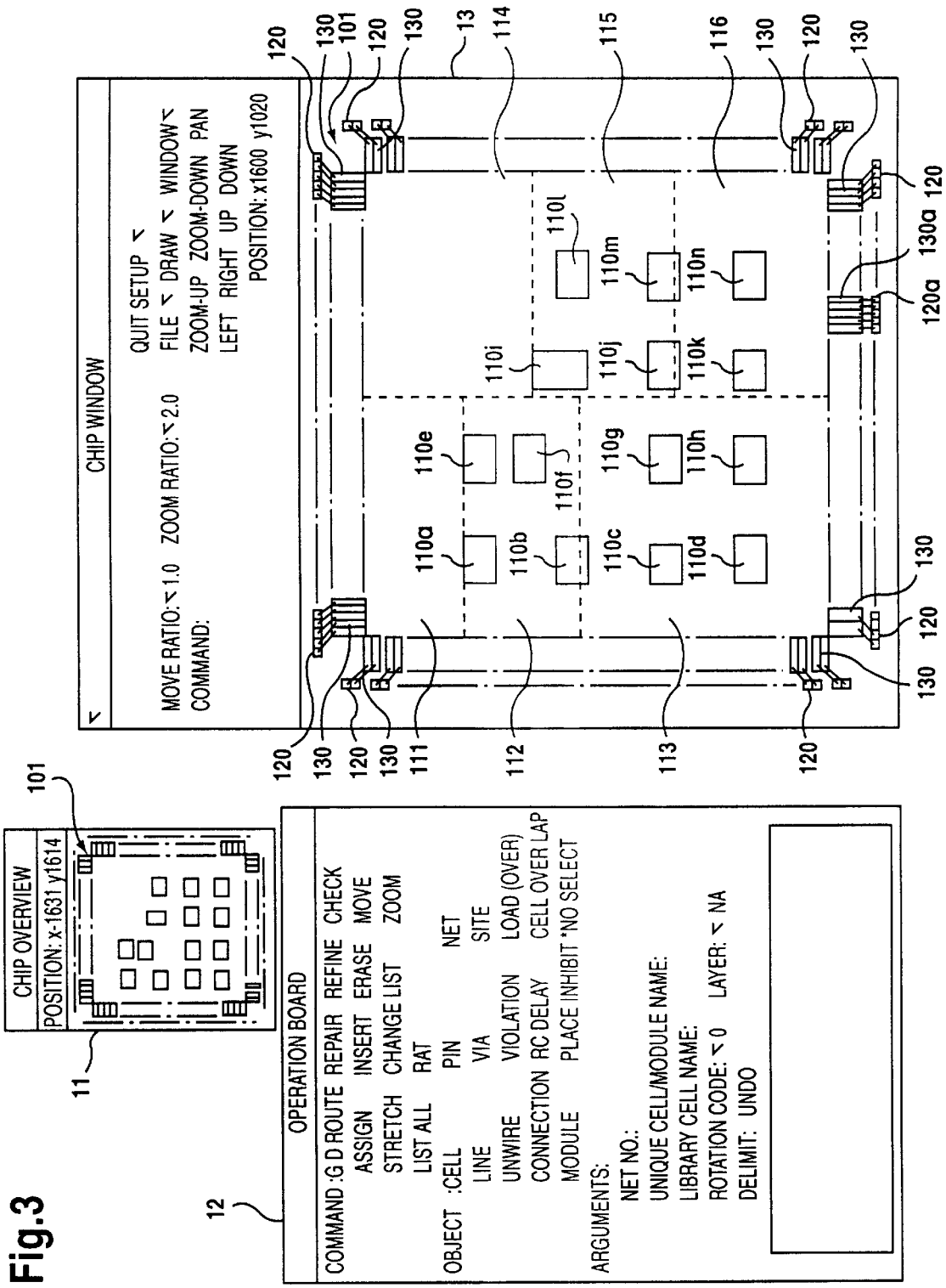
FIG. 3 explains a process of defining modules of a semiconductor IC according to the present invention.
Figure 4:
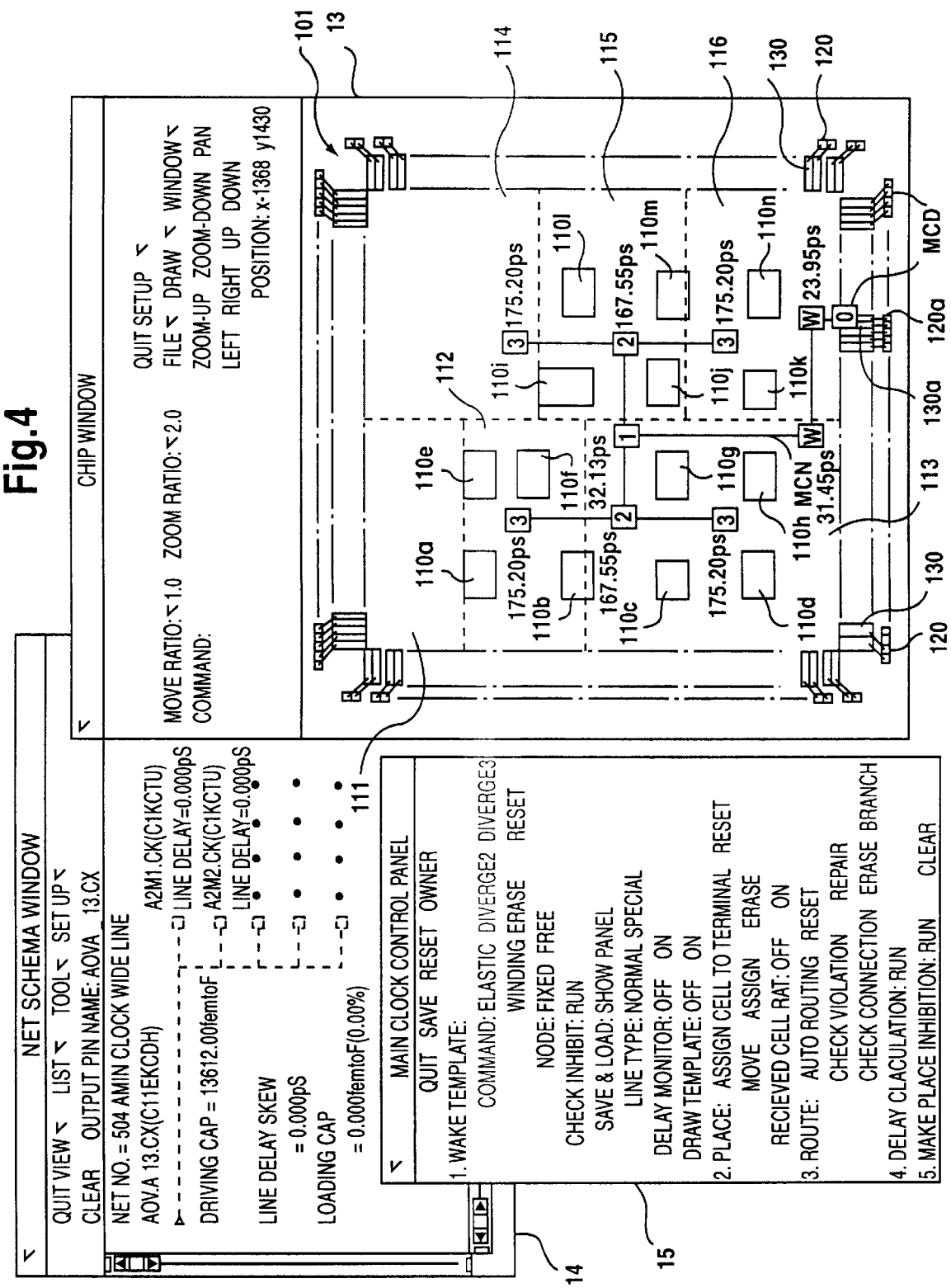
FIG. 4 explains a process of securing an area for a main clock net of the IC according to the present invention.
Figure 5:
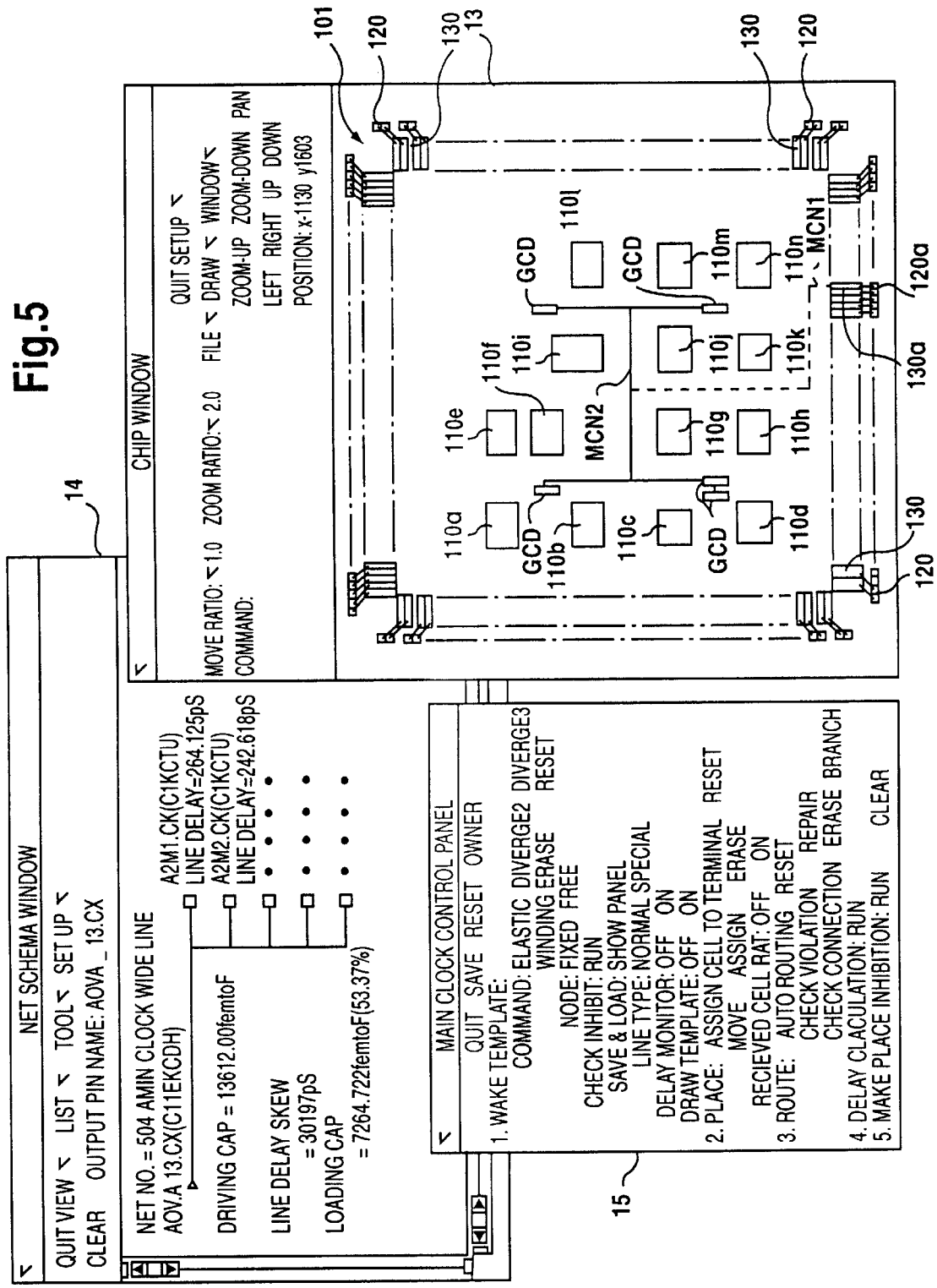
FIG. 5 explains a process of automatically routing the main clock net according to the present invention.

More precisely, FIG. 3 shows a process of setting module areas, FIG. 4 shows a process of securing an area for a main clock net, and FIG. 5 shows a process of automatically routing the main clock net. In these figures, a chip overview window 11 generally displays a chip, an operation board window 12 displays specified operations, a chip window 13 displays placed and routed elements of the chip, a net schema window 14 displays net information, and a main clock control panel window 15 displays main clock control information.

In FIGS. 3 to 5, the chip 101 includes module areas 111 to 116 and layout blocks 110a to 110n for memories, etc. The chip 101 corresponds to a master slice semiconductor IC such as a gate array or a standard cell. The periphery of the chip 101 involves I/O terminals 120 and I/O circuits 130.

In FIG. 3, the module areas are first determined. There are six module areas 111 to 116. Laid-out blocks are read and placed in the modules. Namely, the 14 laid-out blocks 110a to 110n are copied onto the chip 101. Instead of copying the blocks, previously used layout data of blocks may be reused. The process of laying out blocks may be carried out later, for example, after the process of securing an area for a main clock net.

In FIG. 4, an area for a main clock net MCN is secured. A reference mark 0 is an output terminal of a main clock driver MCD 130a, W is a bend, 1 and 2 are branch points, and 3 is an end point of the main clock net. The main clock driver 130a has an I/O terminal 120a. Each of the bends W, branch points 1 and 2, and end points 3 is displayed with estimated delay time in the main clock net.

Global clock drivers GCD to be placed are displayed in the net schema window 14, and they are properly assigned to the end points 3, respectively, as shown in FIG. 5. The global clock drivers may be placed at the bends W and branch points 1 and 2.

In FIG. 5, the main clock net MCN is automatically routed in the area secured as mentioned above. The global clock drivers GCD are placed at the end points 3, respectively. The main clock net MCN includes nets MCN1 and MCN2. The net MCN1 is indicated with a dotted line and extends from the output terminal 0 of the main clock driver 130a to the first branch point 1. The net MCN1 is made of a thick wire. The net MCN2 is indicated with a continuous line and extends from the first branch point 1 to the respective global clock drivers. The net MCN2 is made of a wire of normal width.

Line delay between the output terminal 0 of the main clock driver 130a to the input point of each global clock driver and the skew of the main clock net are displayed in the net schema window 14 of FIG. 5. The lower left end point in FIG. 5 is connected to two global clock drivers, to produce a larger line delay (phase delay) than the other end points. While the main clock net is being automatically routed, placing of elements is prohibited to prevent a short circuit in later processes.

The processes of FIGS. 3 to 5 according to the first aspect of the present invention will be explained next with reference to FIGS. 6 to 13.

Figure 6:
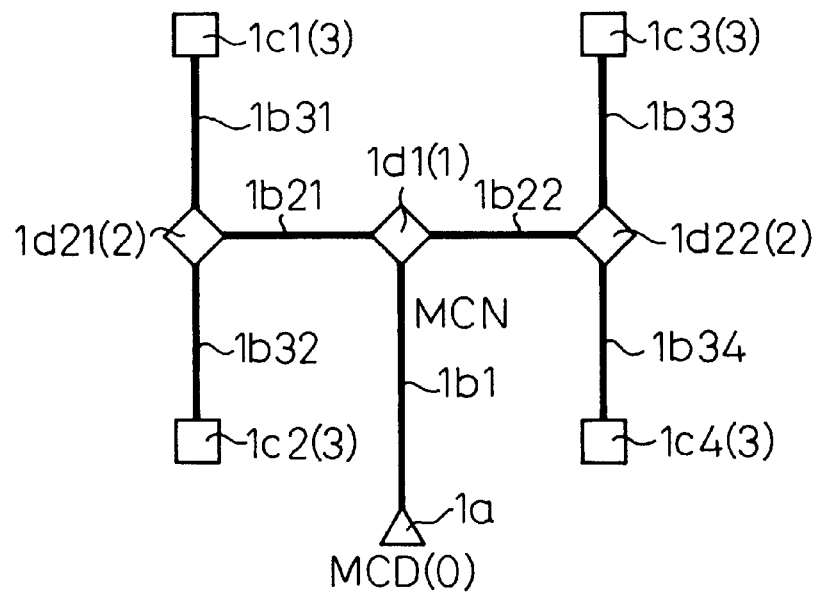
FIG. 6 shows a net displayed on a screen according to a first aspect of the present invention.

FIG. 6 shows an example of a main clock net MCN.

The main clock net includes a start point 1a, lines 1b1, 1b21, 1b22, 1b31, 1b32, 1b33, and 1b34, end points 1c1, 1c2, 1c3, and 1c4, and branch points 1d1, 1d21, and 1d22. The start point 1a corresponds to the output terminal 0 of the main clock driver 130a, the lines 1b1, 1b21, 1b22, 1b31, 1b32, 1b33, and 1b34 correspond to the lines of the nets MCN1 and MCN2, the end points 1c1, 1c2, 1c3, and 1c4 correspond to the end points 3, and the branch points 1d1, 1d21, and 1d22 correspond to the branch points 1 and 2.

Figure 7:
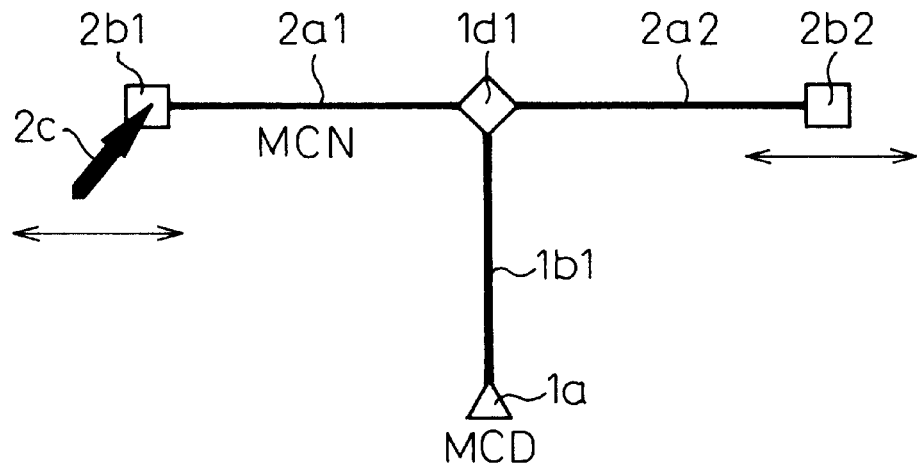
FIG. 7 shows a process of extending and shortening lines according to the first aspect of the present invention.
Figure 8:
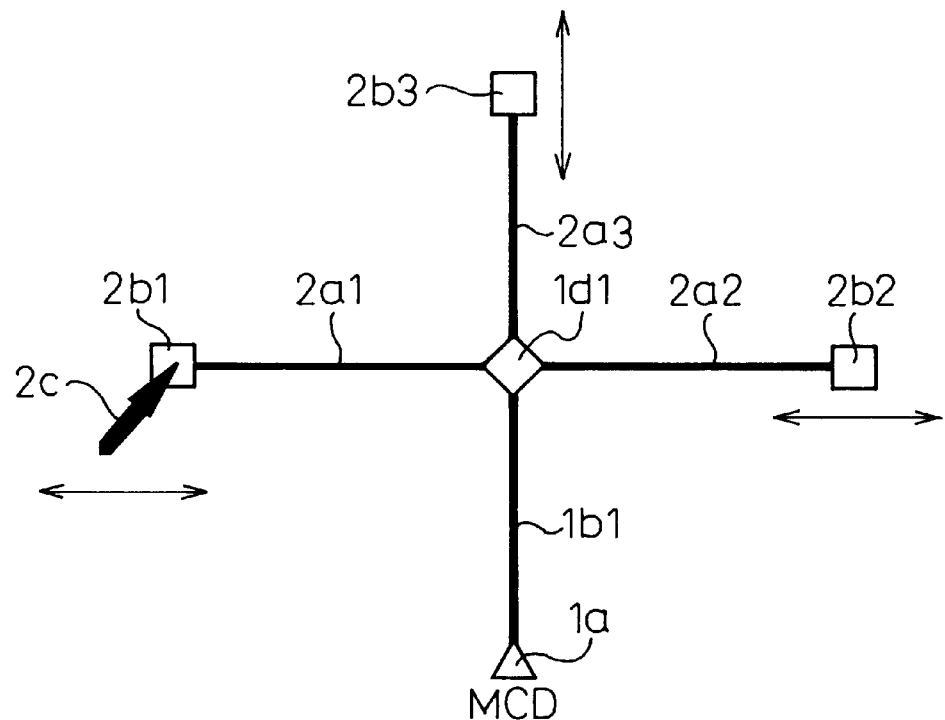
FIG. 8 shows another process of extending and shortening lines according to the first aspect of the present invention.
Figure 9:
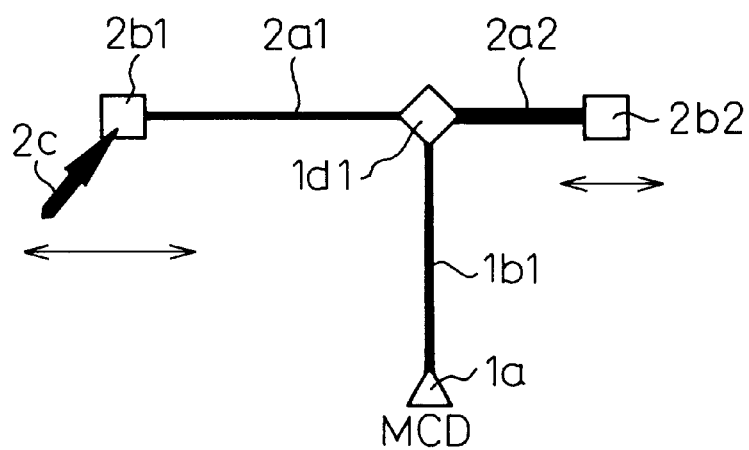
FIG. 9 shows still another process of extending and shortening lines according to the first aspect of the present invention.

FIG. 7 shows an example of a process of extending and shortening a line according to the first aspect of the present invention. FIGS. 8 and 9 show other processes of extending and shortening a line. The first aspect of the present invention deals with a clock net between a main clock driver and end points, and the second aspect of the present invention deals with a reserved line between a local clock driver and flip-flops.

In FIG. 7, a cursor 2c in the chip window 13 on the display is manipulated to move an end point 2b1. According to the movement of the end point 2b1, the other end point 2b2 also moves in an extending or shortening direction. When a line 2a1 from a branch point 1d1 to the end point 2b1 in the main clock net is extended, a line 2a2 from the branch point 1d1 to the other end point 2b2 is extended by a length equal to the extension in the line 2a1. On the other hand, when the line 2a1 is shortened, the line 2a2 is also shortened accordingly. Irrespective of the expansion or shortening in the line 2a1, a line 1b1 from the output terminal 1a of the main clock driver to the branch point 1d1 is unchanged.

FIG. 8 involves three end points 2b1, 2b2, and 2b3, instead of the two end points 2b1 and 2b2 of FIG. 7. When the cursor 2c is manipulated to move the first end point 2b1, the end points 2b2 and 2b3 are moved accordingly. Namely, when a line 2a1 from a branch point 1d1 to the end point 2b1 in the main clock net is extended, a line 2a2 from the branch point 1d1 to the end point 2b2 and a line 2a3 from the branch point 1d1 to the end point 2b3 are also extended by the extension in the line 2a1. Similarly, when the line 2a1 is shortened, the lines 2a2 and 2a3 are shortened accordingly. Irrespective of the extension or shortening in the line 2a1, a line 1b1 from the output terminal 1a of the main clock driver to the branch point 1d1 is unchanged.

In this way, lines from a branch point to end points are extended or shortened according to an expansion or a shortening in one line, so that the lines from the output terminal 1a to the end points 2b1, 2b2, 2b1, 2b2, and 2b3 may have identical delay times in transmitting a clock signal.

FIG. 9 shows lines 2a1 and 2a2 of different lengths. When the cursor 2c is manipulated to move an end point 2b1, the other end point 2b2 is extended or shortened according to a change in line capacitance or line resistance due to the movement of the end point 2b1. Namely, when the line 2a1 is extended or shortened, the line 2a2 is extended or shortened according to a change in the capacitance or resistance of the line 2a1, so that a change in the capacitance or resistance of the line 2a2 may correspond to the change in the capacitance or resistance of the line 2a1.

Even if the widths of lines from a branch point to end points differ from one another, one of the lines may be extended or shortened according to a change in the capacitance or resistance of another that has been extended or shortened. As a result, the lines from the output terminal 1a of the main clock driver to the end points 2b1 and 2b2 may have identical delay times for transmitting a signal.

Figure 10:
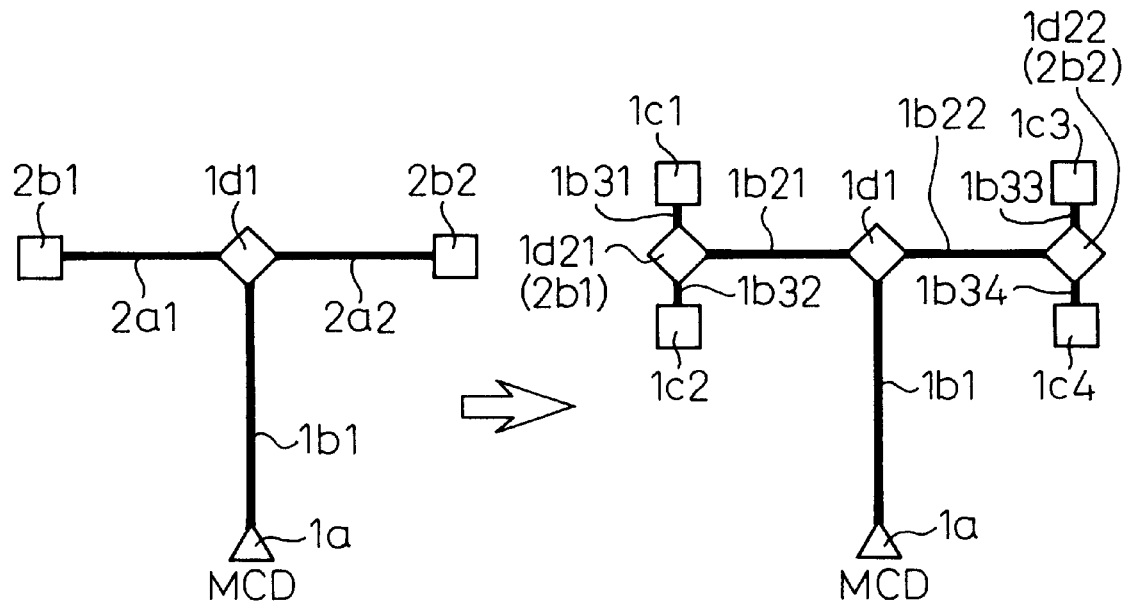
FIG. 10 shows a process of branching a line according to the first aspect of the present invention.

FIG. 10 shows a process of branching a line according to the first aspect of the present invention. This example branches an end point into two end points.

Namely, an end point 2b1 is divided into two end points 1c1 and 1c2. If required at this time, an instruction may be issued to branch the other end point 2b2 into two end points 1c3 and 1c4. In this case, the lengths of lines 1b33 and 1b34 between the branch point 1d22 (2b2) and the end points 1c3 and 1c4 correspond to the lengths of lines 1b31 and 1b32 between the branch point 1d21 (2b1) and the end points 1c1 and 1c2. Similar to the embodiment of FIG. 9, the length of each line is determined according to a change in the capacitance or resistance of a line that has been extended or shortened, if the lines have different widths.

As a result, lines from the output terminal 1a of the main clock driver to the end points 1c1, 1c2, 1c3, and 1c4 have identical delay times for transmitting a signal, even if the lines are branched. This makes the designing of branches easier.

Figure 11:
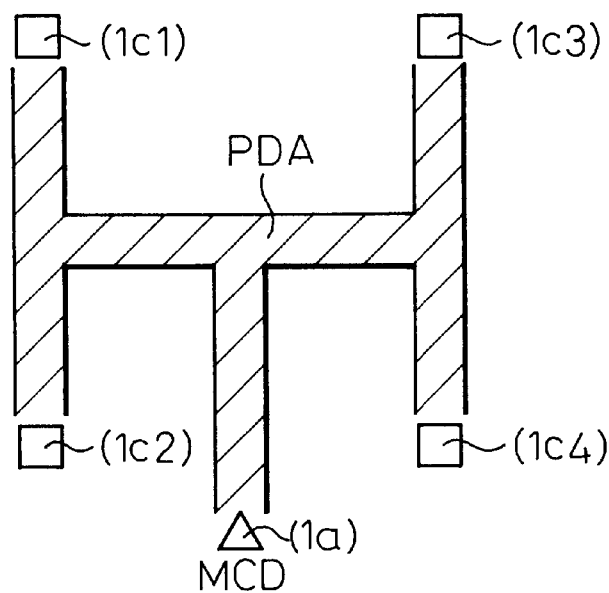
FIG. 11 shows predetermined routes according to the first aspect of the present invention.

FIG. 11 shows a predetermined routing area. For example, the lines from the output terminal 1a of the main clock driver to the four end points 1c1, 1c2, 1c3, and 1c4 in the main clock net are routed in the predetermined area PDA of FIG. 11. The wiring area PDA is reserved for routing lines. This technique is advantageous in calculating the range of delay to occur when transmitting a signal through the lines to be laid in the area PDA.

FIG. 12 shows calculations of arrival time of a signal. A reference mark Tarrival(n) is arrival time at a branch point or end point n, Ceffect(n) is line capacitance at the point n, and Cload(n) is line resistance at the point n. Rline(n) and Cline(n) are resistance and capacitance values calculated according to the length of a line between branch points, or between a branch point and an end point.

According to the first aspect of the present invention, delay (arrival time) calculated as shown in FIG. 12 is displayed in the vicinity of the corresponding branch or end point. The arrival time of a clock signal at a branch or end point may be calculated according to a known technique.

Figure 13:
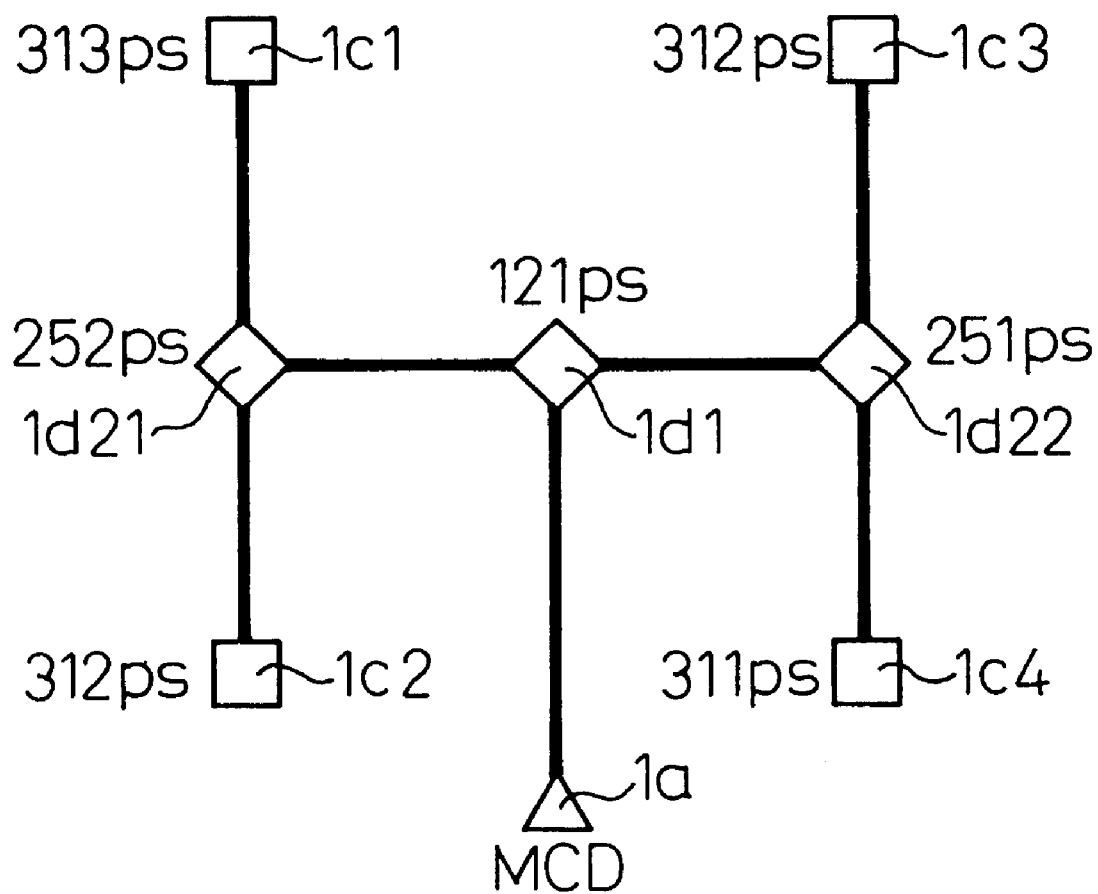
FIG. 13 shows arrival time of a signal according to the first aspect of the present invention.

FIG. 13 shows signal arrival time (delay) at each of the branch points and end points in the main clock net of FIG. 6 displayed in the chip window 13. In the window 13, an operator may confirm the delay time at each branch or end point before actually routing the main clock net. The width of each line of the main clock net may be automatically determined to minimize the delay time at each branch or end point.

As explained above, the first aspect of the present invention is capable of optimizing the layout of a semiconductor IC through interactive operations. The first aspect of the present invention provides information for reducing skew and supports layout work. Consequently, the first aspect of the present invention improves the performance of the IC and the efficiency of the layout work.

Figure 14:
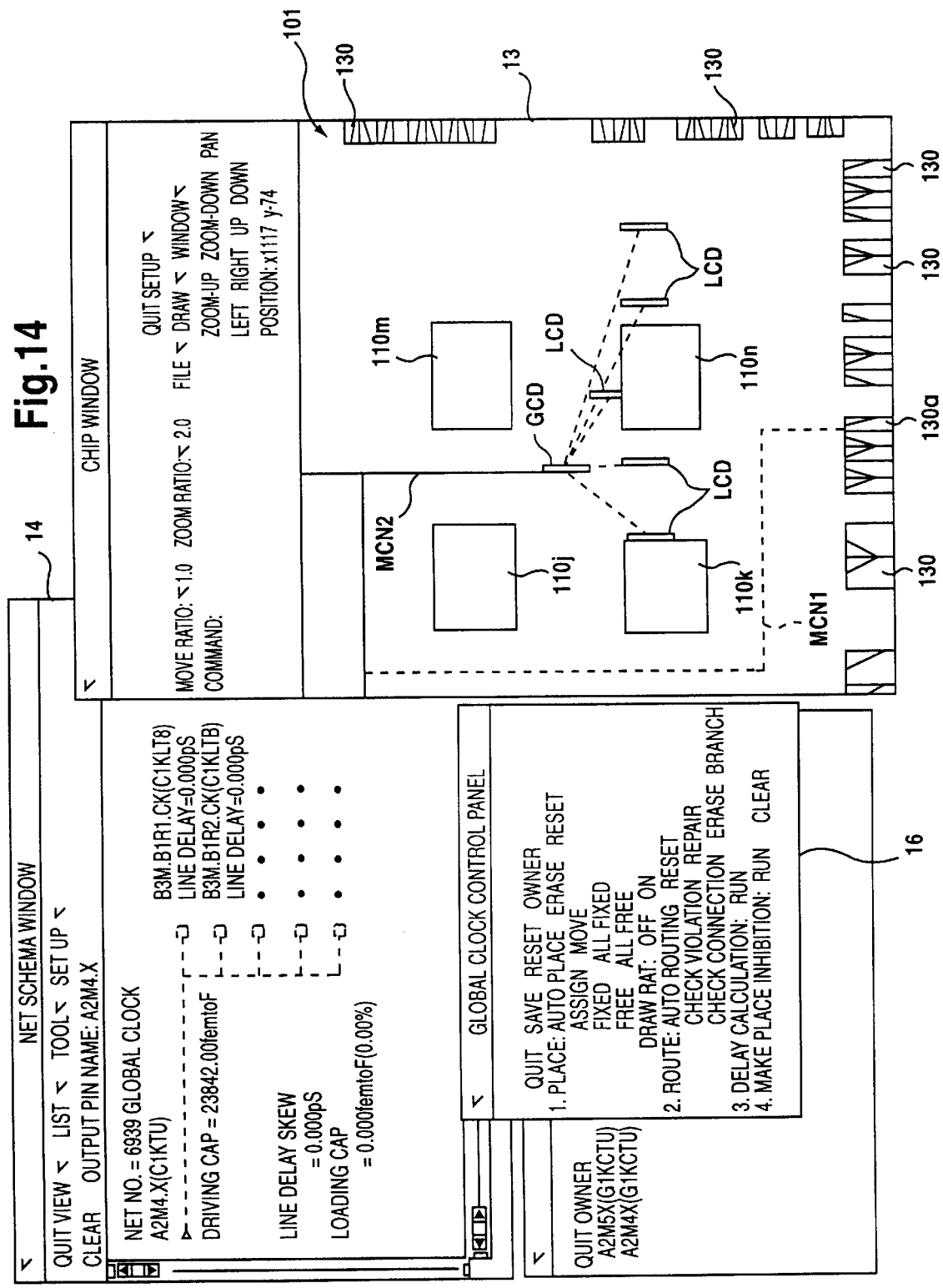
FIG. 14 explains a process of placing local clock drivers of the IC according to the present invention.
Figure 15:
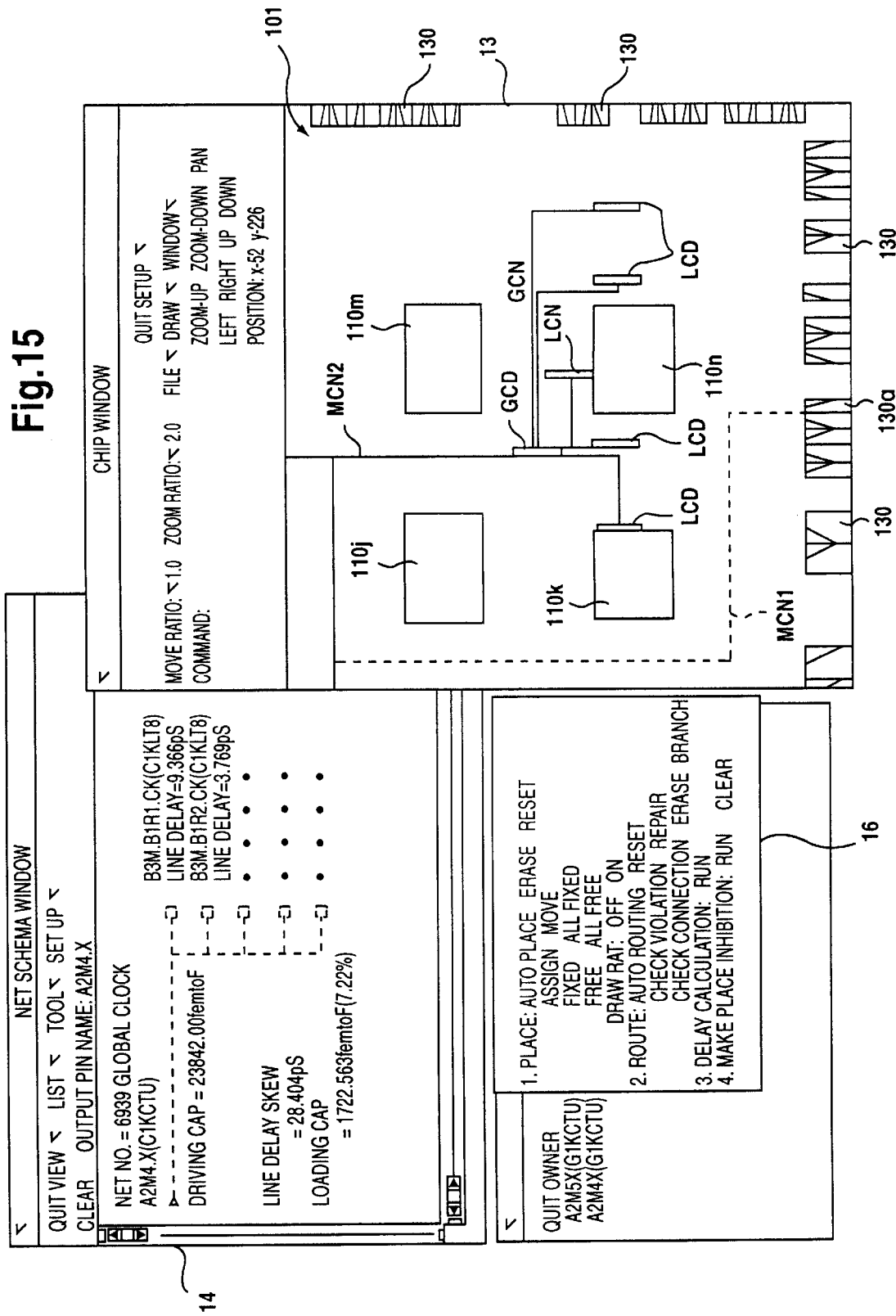
FIG. 15 explains a process of routing a global clock net of the IC according to the present invention.
Figure 16:
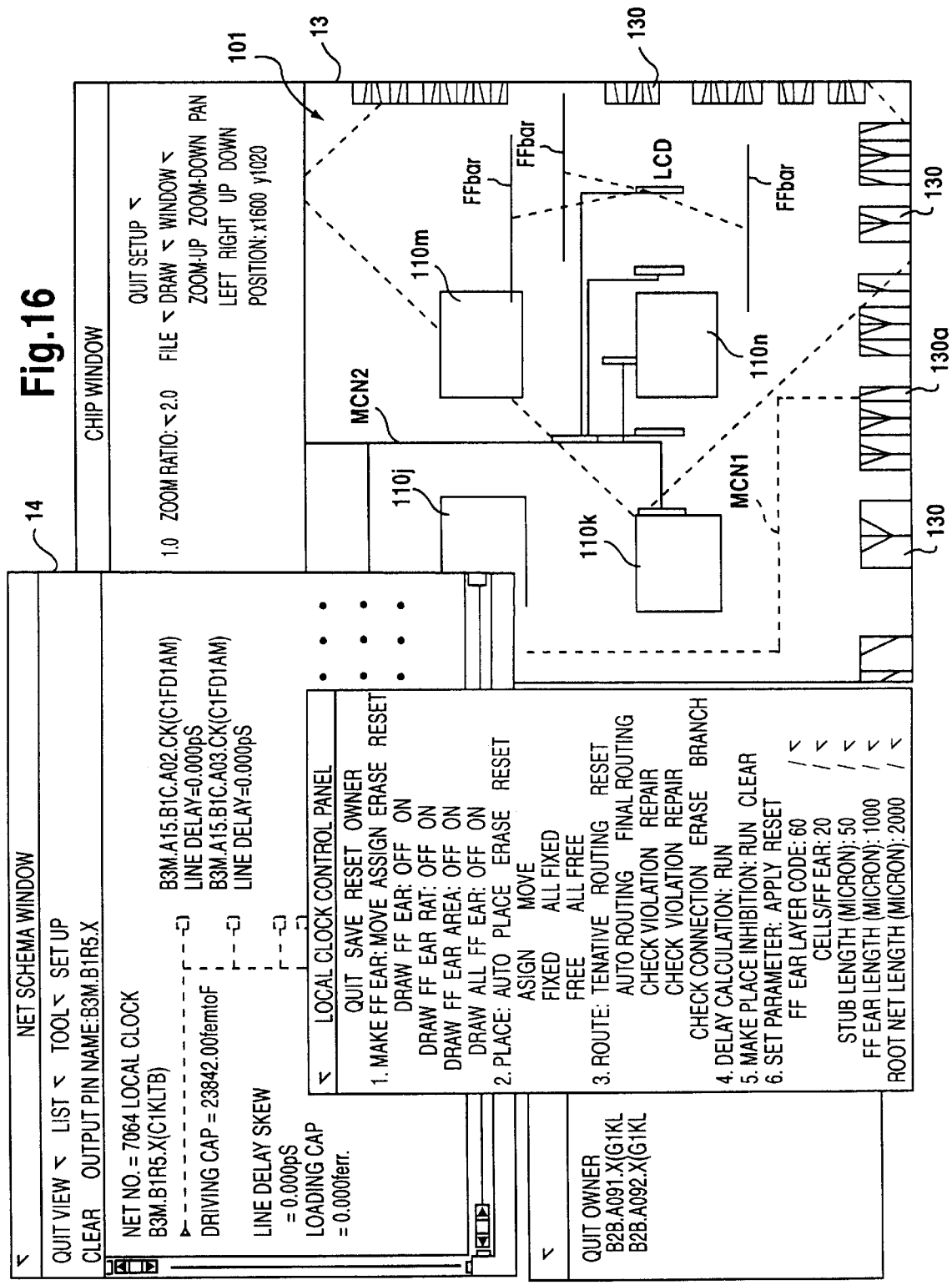
FIG. 16 explains a process of securing an area for placing flip-flops of the IC according to the present invention.
Figure 17:
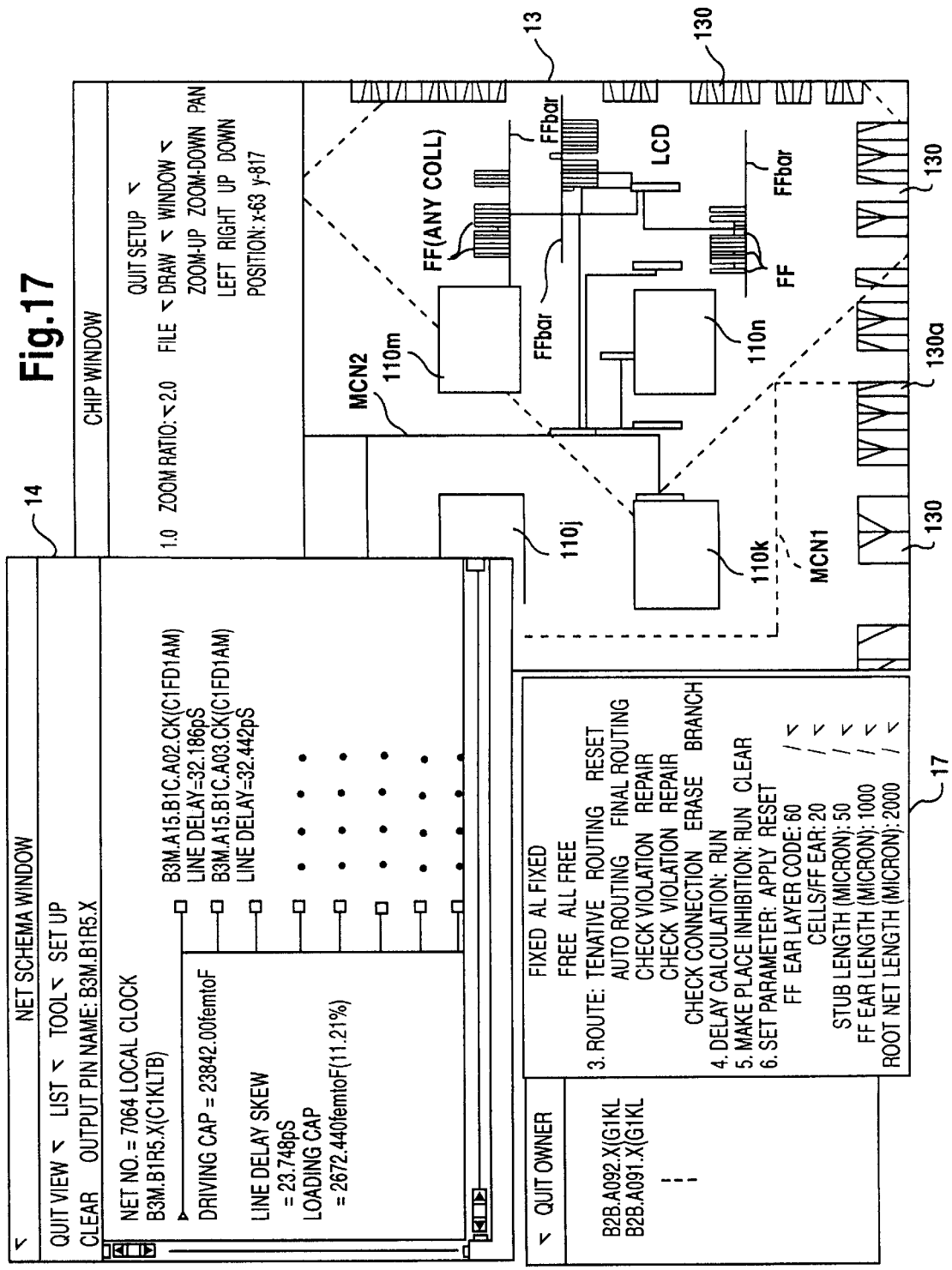
FIG. 17 explains a process of initially placing flip-flops of the IC according to the present invention.
Figure 18:
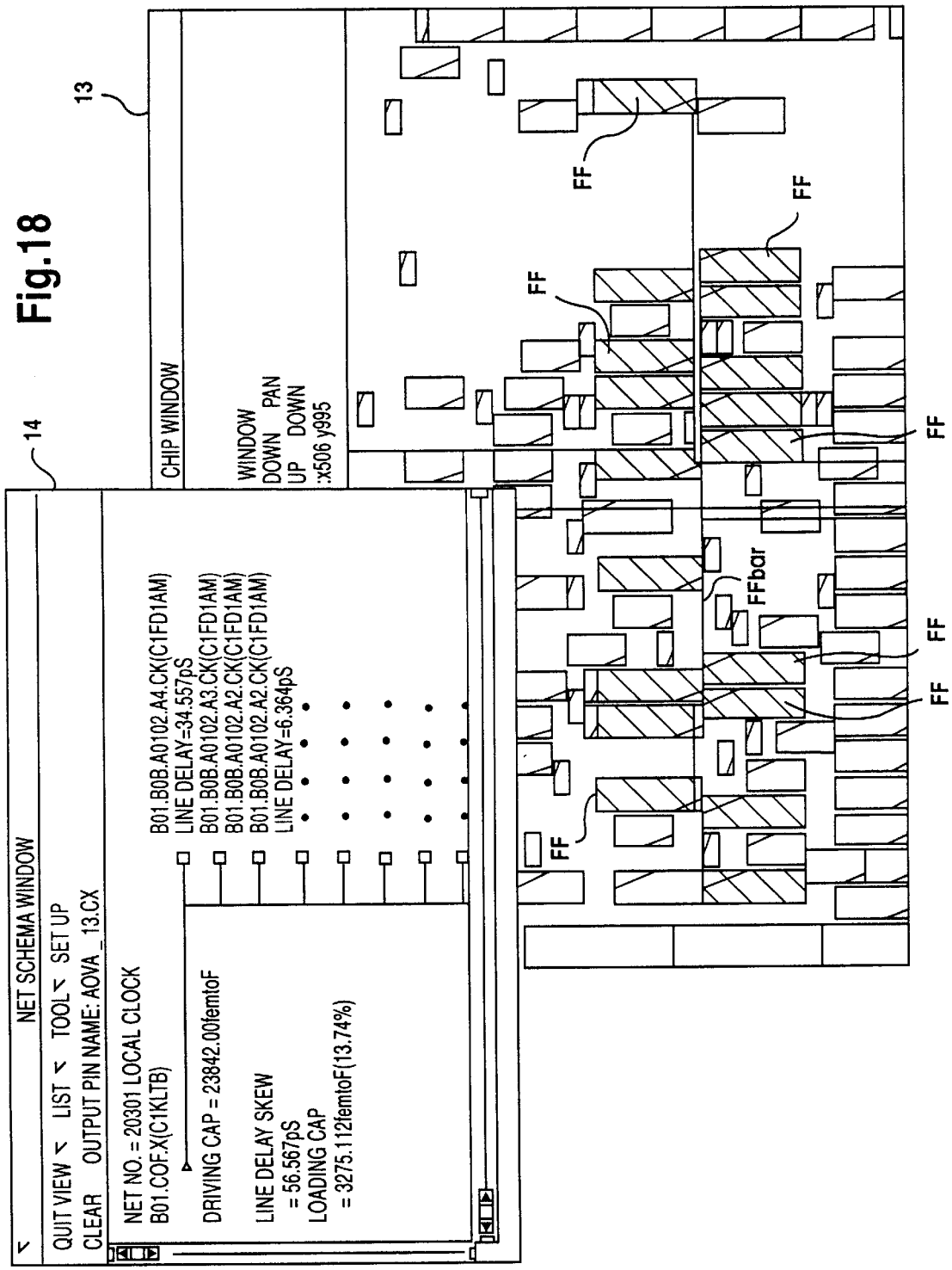
FIG. 18 explains a process of automatically placing elements of the IC according to the present invention.

FIG. 14 explains a process of placing local clock drivers in a semiconductor IC, FIG. 15 explains a process of routing a global clock net, FIG. 16 explains a process of setting an area for placing flip-flops, FIG. 17 explains a process of initially placing the flip-flops, and FIG. 18 explains a process of automatically placing elements of the IC, according to the second aspect of the present invention. Throughout the figures, a global clock control panel window 16 displays global clock control information, and a local clock control panel window 17 displays local clock control information.

In FIG. 14, local clock drivers (LCDs) are placed after the automatic routing of the main clock net of FIG. 5. The local clock drivers may be automatically placed uniformly in a module area. If the automatically placed drivers are not satisfactory, they may be adjusted.

FIG. 14 shows five local clock drivers. In the chip window 13 of FIG. 14, the local clock drivers are shown connected to a global clock driver (GCD) with dotted lines because they are not routed yet. Namely, a net shown in the chip schema window 14 is not completed yet, and therefore, the net is indicated with the dotted lines in the chip window 13.

In FIG. 15, the global clock net is routed, i.e., the global clock driver is routed to the local clock drivers. To suppress skew, the global clock driver is directly connected to the local clock drivers. At this time, line delay and skew between the output of the global clock driver and the inputs of the local clock drivers are displayed in the net schema window 14. During this process, placing elements is prohibited to prevent a short circuit in later processes. The global clock net may be equidistantly routed to suppress skew. FIGS. 14 and 15 show the chip window 13, net schema window 14, and global clock control panel window 16.

In FIG. 16, guide lines, i.e., reserved lines (FFbar) are set to efficiently place flip-flops. The flip-flops are placed along each reserved line such that the bottom of each flip-flop is on the reserved line. This arrangement minimizes wiring because each flip-flop has a clock terminal at the bottom thereof. The number of flip-flops allocated is equal to the number of reserved lines, to equalize the capacitance of the reserved lines. This enables the skew of the net to be controlled by only adjusting distances from the local clock drivers to the reserved lines.

In the local clock control panel window 17 of FIG. 16, a parameter "Cells/FFbar" indicates the number of one-bit flip-flops on a reserved line FFbar, "Stub Length" indicates a maximum line length from a reserved line FFbar to flip-flops, "FFbar Length" indicates the maximum length of a reserved line, and "Root Net Length" indicates a maximum line length from a local clock driver to a reserved line FFbar. In the chip window 13, a diamond indicated with a dotted line represents the maximum length of a root net. If the center of a reserved line is out of the diamond, a skew larger than an estimated value will occur. In FIG. 16, there are three reserved lines.

In FIG. 17, the flip-flops are automatically placed along each reserved line. Cells connected to a local clock net (LCN) are recognized as flip-flops, and the cells are uniformly allocated for reserved lines. Accordingly, any cells including flip-flops are routed with low skew. Thereafter, the cells are annealed. The annealing will be explained later in detail. At this time, the flip-flops are moved along the respective reserved lines, to maintain estimated skew. It is possible to exchange the flip-flops with one another among the reserved lines. The net schema window 14 is used to confirm line delay and skew between the output of each local clock driver to the flip-flops. If the flip-flops are exchanged with one another, the skew will change.

In FIG. 18, cells not yet placed are automatically placed and traded. In the chip window 13 of FIG. 18, hatched cells are flip-flops driven by local clock drivers. The flip-flops may be annealed on the respective reserved lines. At this time, routes between the local clock drivers and the flip-flops are fixed. Since the flip-flops are lined up as shown in FIG. 18, channels occupied by the local clock net will be minimized. Due to the small amount of skew, a timing fault will not occur. To prevent a timing fault, the following must be satisfied:

skew time (skew)<(transmission time of flip-flops+ transmission time between flip-flops–hold time of flip-flops)

Figure 19:
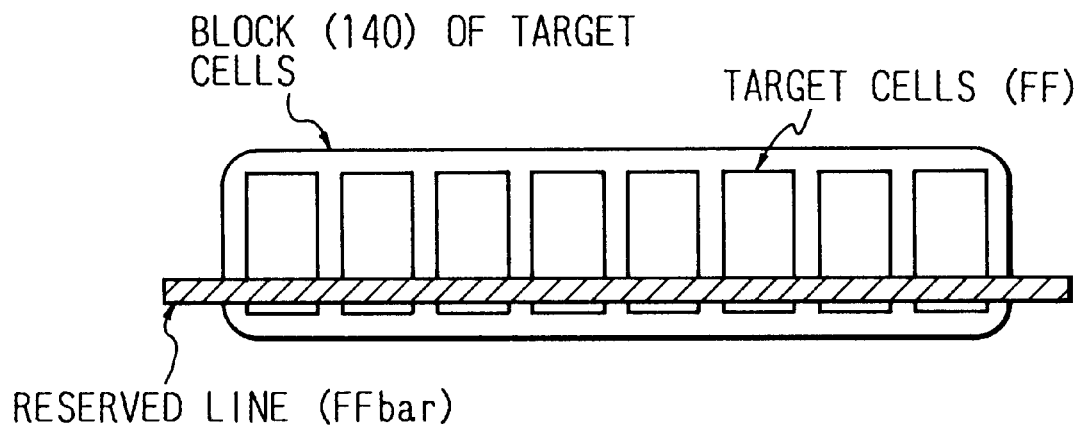
FIG. 19 explains a block of target cells arranged along a reserved line according to a second aspect of the present invention.
Figure 20:
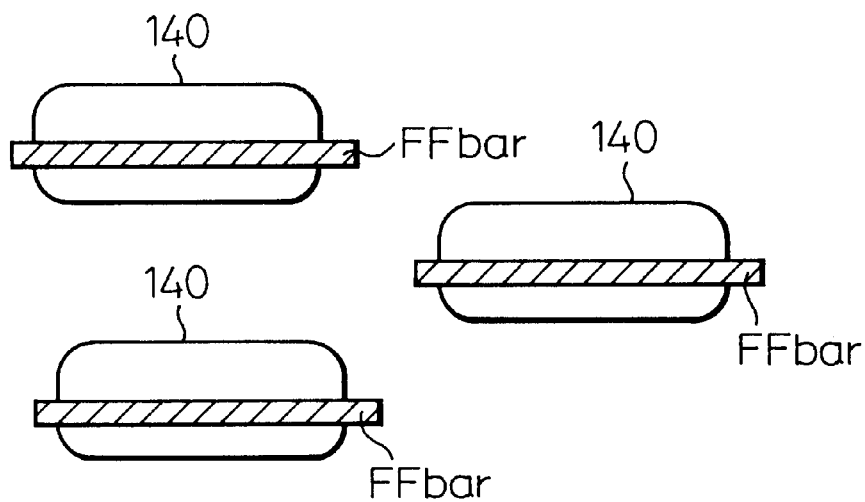
FIG. 20 shows blocks of target cells according to the second aspect of the present invention.
Figure 21:
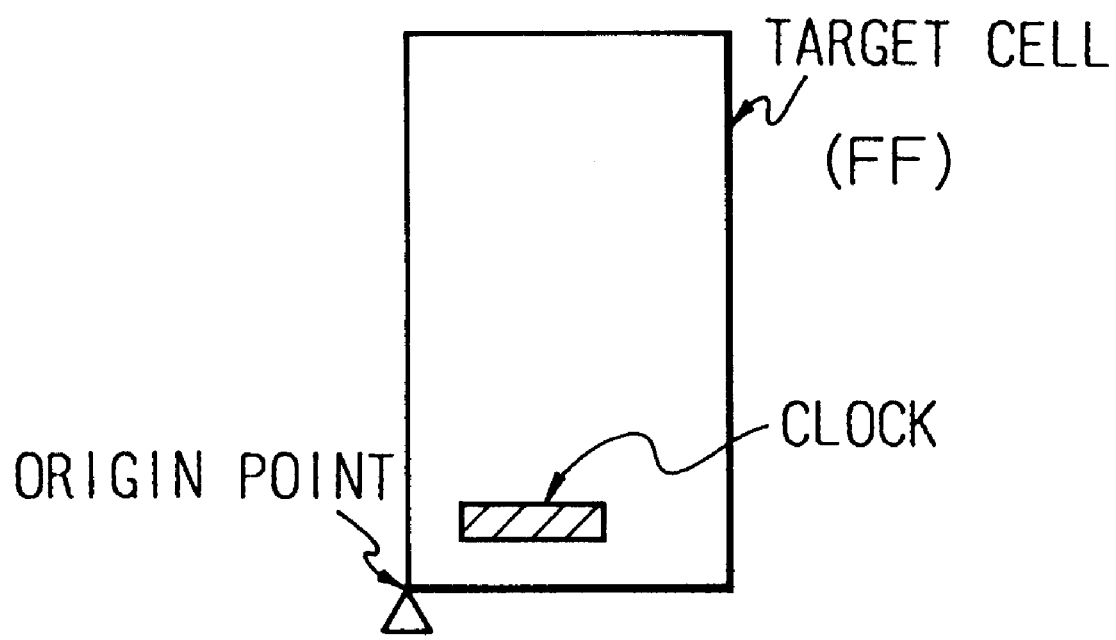
FIG. 21 shows the position of a clock terminal in a target cell according to the second aspect of the present invention.

FIG. 19 shows a block of target cells placed along a reserved line, FIG. 20 shows blocks of target cells, and FIG. 21 shows the position of a clock terminal in a target cell, according to the second aspect of the present invention.

In FIG. 19, a reserved line FFbar is set to efficiently place target cells, i.e., flip-flops along the reserved line. The target cells form a block 140 corresponding to a reserved area.

FIG. 20 shows blocks 140 of target cells. The size of each block 140 is predetermined. Namely, the range of delay time in each block 140 is known. The clock terminal of each target cell is at the bottom thereof as shown in FIG. 21. When the bottom of each target cell is positioned along the reserved line as shown in FIG. 19, no waste wiring will be formed.

Figure 22:
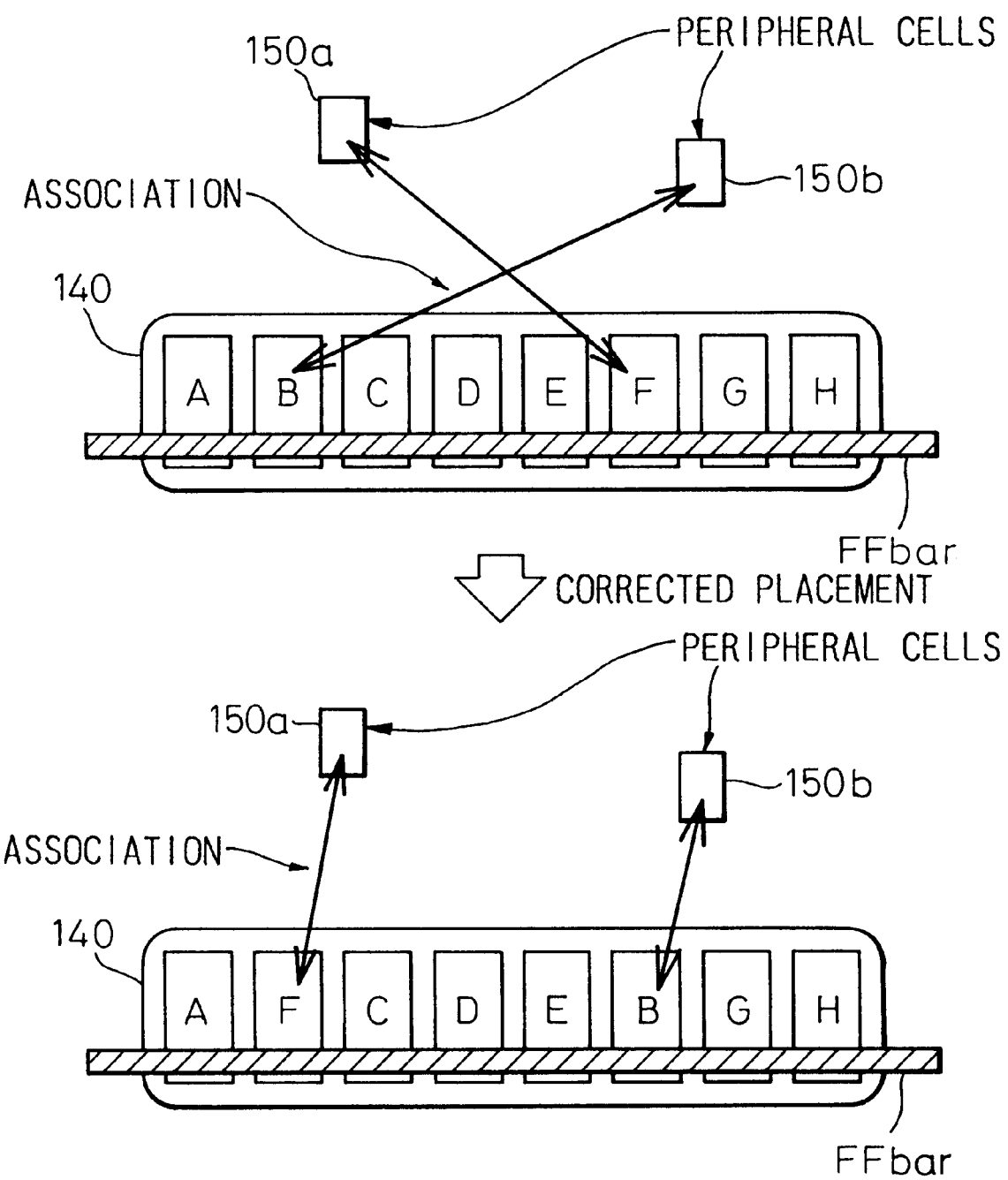
FIG. 22 shows an improvement in an arrangement of target cells in a block according to the second aspect of the present invention.

FIG. 22 shows a process of improving the arrangement of target cells in each block, and FIG. 23 shows another process of improving the arrangement of target cells among blocks, according to the second aspect of the present invention. These processes are the annealing mentioned in connection with FIG. 17.

In FIG. 22, a cell (flip-flop) B in a block 140 is associated with a peripheral cell 150b, and a cell F in the block 140 is associated with a peripheral cell 150a. These cells in the block 140 are rearranged to shorten routes. Namely, the cells B and F are replaced with each other. Since the cells B and F are on the same reserved line, they are included in the range of delay time of the reserved line.

In FIG. 23, a cell (flip-flop) E in a block 140a is associated with a peripheral cell 150d, and a cell K in a block 140b is associated with a peripheral cell 150c. In this case, the cell E in the block 140a on a reserved line FFbar1 is replaced with the cell K in the block 140b on a reserved line FFbar2, to shorten routes.

Figure 24:
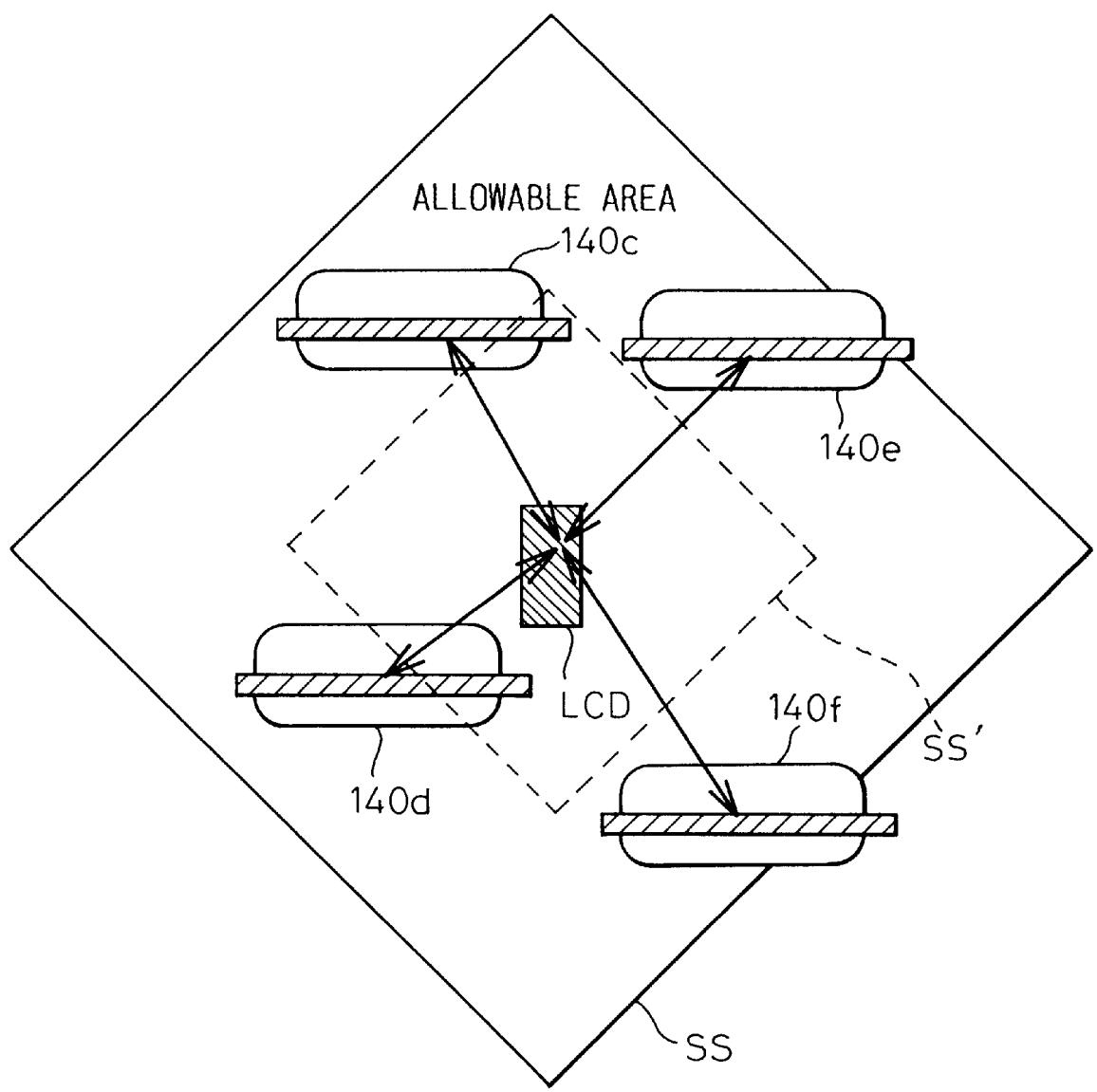
FIG. 24 shows an allowable area for placing blocks of target cells according to the second aspect of the present invention.

FIG. 24 shows an allowable area for placing blocks of target cells. Namely, blocks 140c, 140d, 140e, and 140f of target cells are placed in a diamond area such as a Manhattan Diamond area SS so that the blocks satisfy a target skew with respect to a driver cell, i.e., a local clock driver LCD. The driver cell LCD may be connected to the blocks 140c to 140f through star wiring, so that the range of delay time in these blocks is calculable. Namely, the skew of target cells in each block may be limited within a predetermined range.

The area for placing the blocks 140c to 140f of target cells may be between an outer area SS and an inner area SS'. This technique sets the upper and lower limits of the range of delay time of blocks. The number of the blocks of target cells may be at least one.

Figure 25:
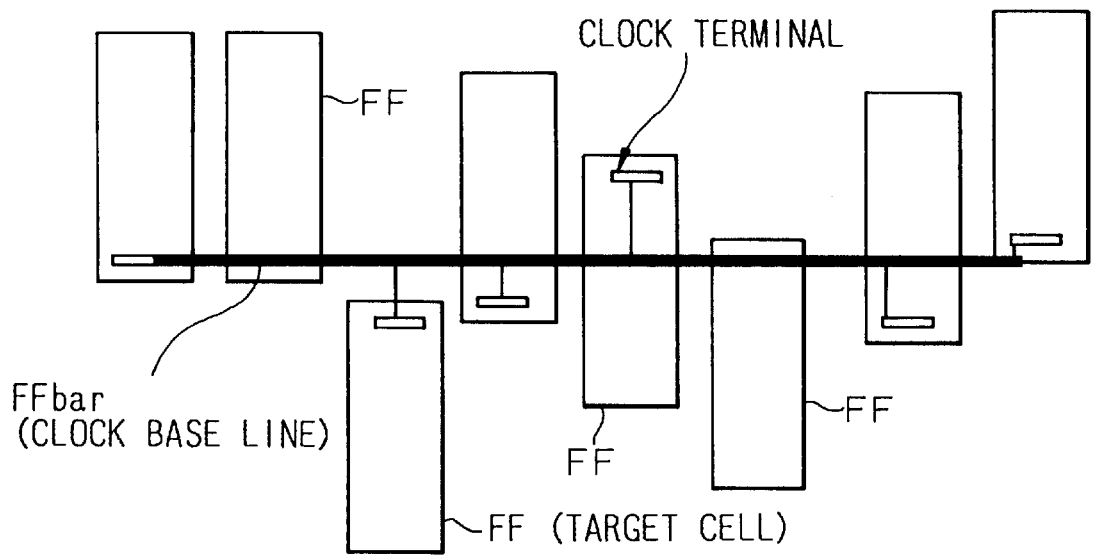
FIG. 25 shows a line in a block of target cells according to the second aspect of the present invention.
Figure 26:
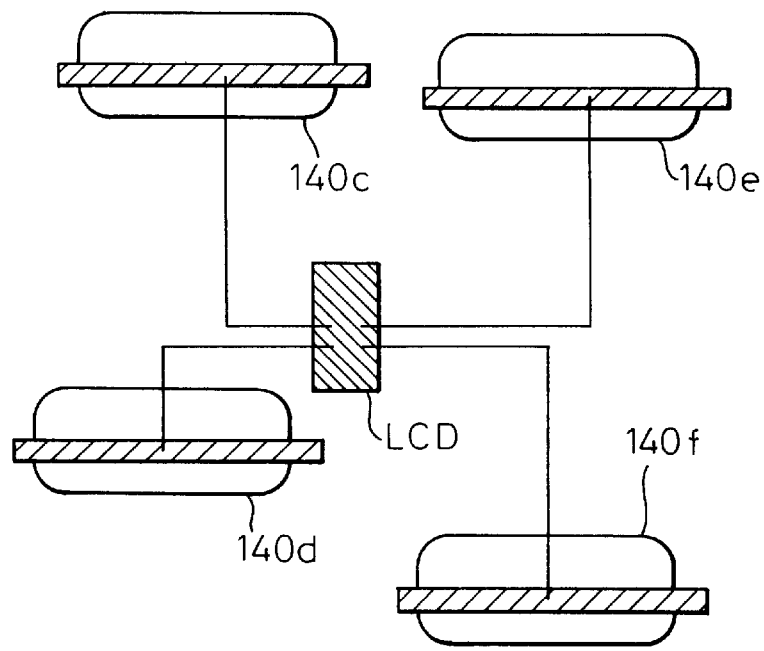
FIG. 26 shows lines between a driver and blocks of target cells according to the second aspect of the present invention.

FIG. 25 shows routes of target cells in a block and FIG. 26 shows routes between a driver and blocks of target cells, according to the second aspect of the present invention.

In FIG. 25, a reserved line FFbar serves as a base line along which flip-flops are placed like a spine. The terminal of a driver is not shown.

In FIG. 26, a driver LCD is connected to blocks 140c to 140f of target cells through star wiring with the driver serving as a root, so that the range of delay time of the blocks is known in advance.

Figure 27:
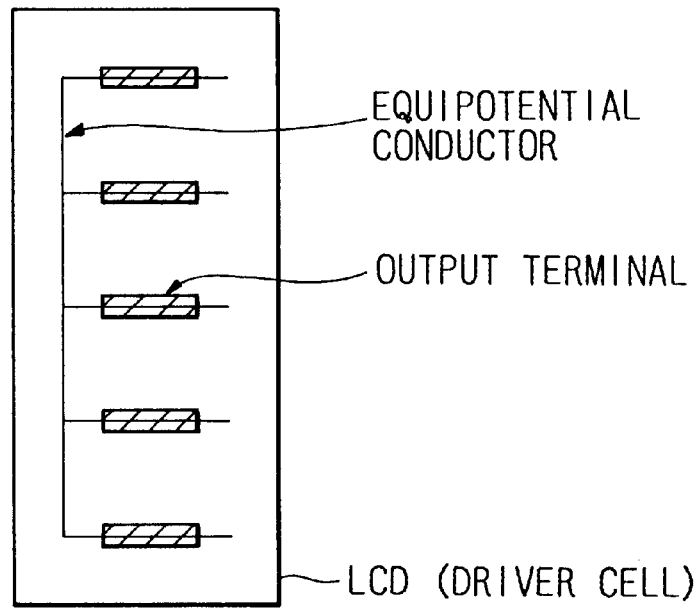
FIG. 27 explains output terminals of a driver cell according to the second aspect of the present invention.
Figure 28:
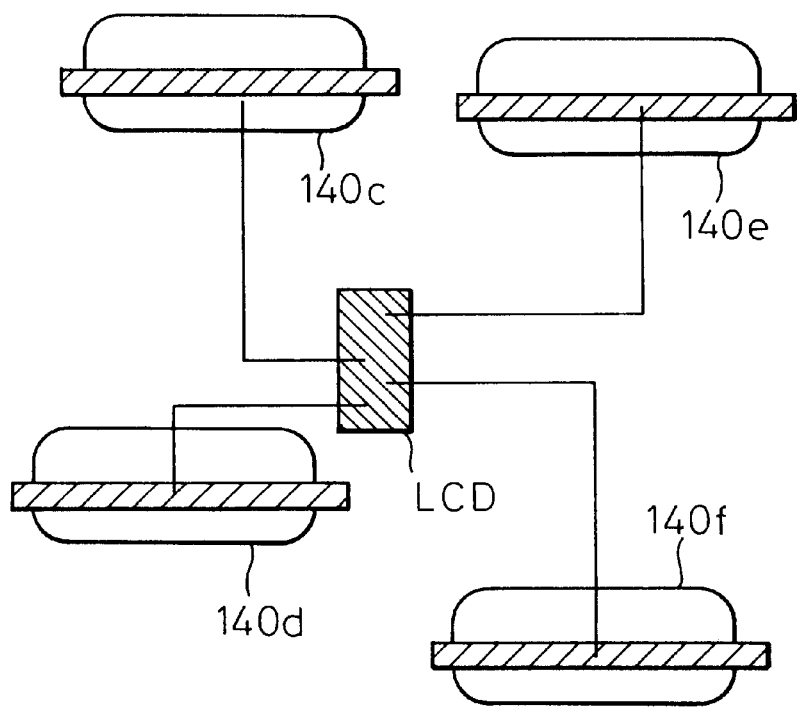
FIG. 28 shows lines between a driver and blocks of target cells according to the second aspect of the present invention.

FIG. 27 explains output terminals of a driver cell, and FIG. 28 shows routes between a driver and blocks of target cells.

In FIG. 27, the output terminals of the driver cell, i.e., the local clock driver (LCD) have the same potential and different terminal definitions. Accordingly, the output terminals of the driver cell may be connected to the blocks of target cells, respectively, to realize star wiring.

In this way, the second aspect of the present invention is capable of reducing skew, line delay, route lengths, and a wiring area, to improve circuit integration. The second aspect is also capable of reducing the capacitance and resistance of wiring and power consumption, improving an operation speed, and minimizing faults due to electromigration.

Figure 29:
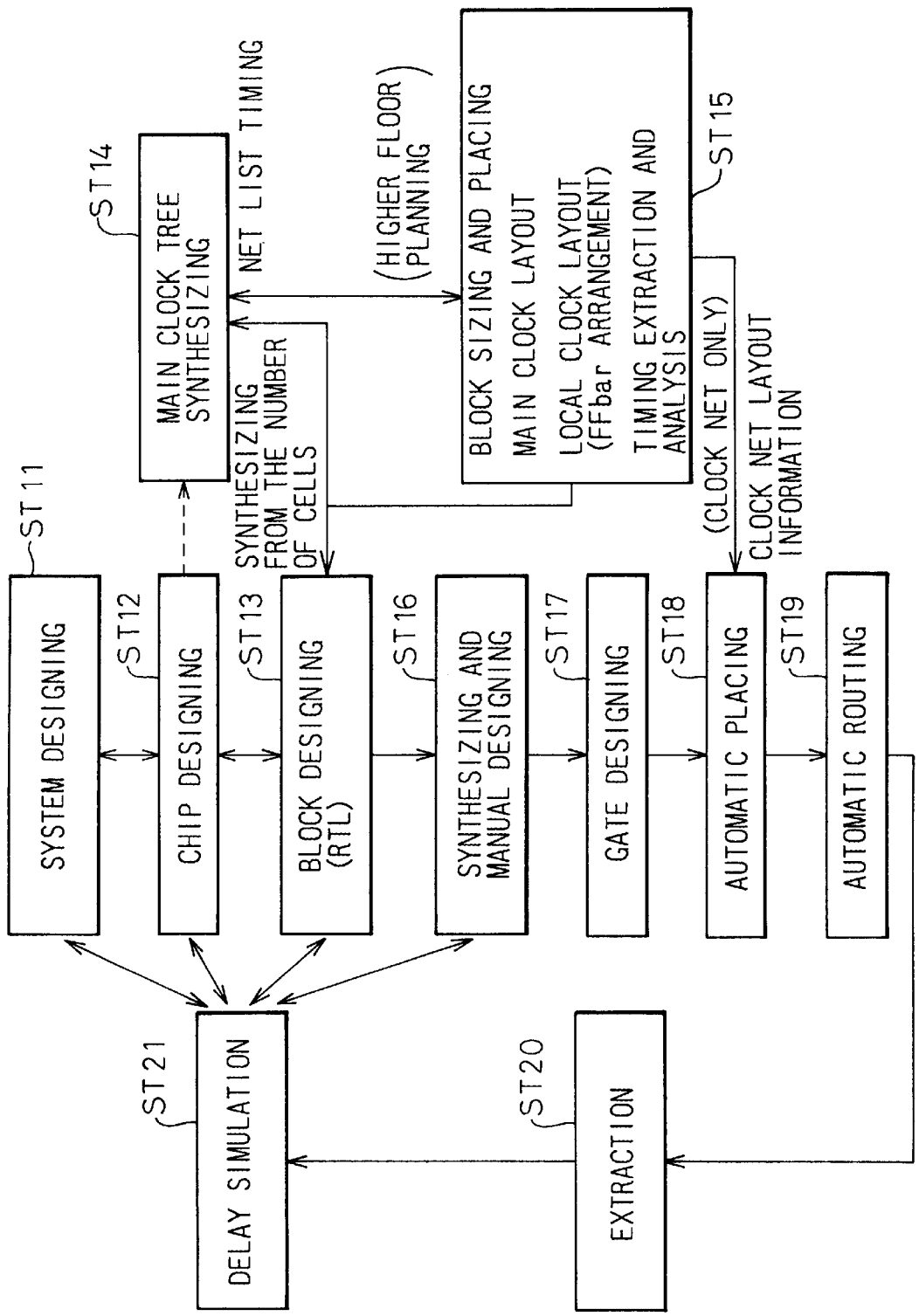
FIG. 29 is a flowchart showing the steps of placing and routing elements of a semiconductor IC according to the present invention.

FIG. 29 is a flowchart showing the steps of placing and routing elements of a semiconductor IC according to the present invention.

Step ST11 designs a system or a board. Step ST12 designs chips. Step ST13 designs blocks. Step ST14 is characteristic to the present invention and synthesizes a main clock tree.

Step ST15 carries out the sizing and placing of blocks (FIG. 3), the placing of main clocks (FIGS. 4 to 13), the placing of local clocks (FIGS. 14 to 28), and the extracting and analyzing of timing, which is called as a higher floor plan in this specification. The step ST15 prepares clock net information, which is used by the step ST13 to design blocks. The step ST15 also prepares clock layout information, which is used by step ST18 to automatically place elements.

After the step ST13, step ST16 synthesizes data and manually designs elements. Step ST17 designs gates. Step ST18 automatically places the elements, and step ST19 automatically routes the elements.

Step ST20 extracts predetermined cells out of the IC (chip) that has been placed and routed. Step ST21 calculates delay, i.e., signal arrival time and simulates the operation of the circuit. Results of the calculation and simulation are fed back to the steps ST11 to ST14, to change the conditions of these steps.

Compared with the prior art of FIG. 1, the steps ST13 to ST15 deal with clock signal nets such as main clock nets, global clock nets, and local clock nets and flip-flops connected to the clock signal nets, and prepare reserved lines along which the flip-flops are placed. Consequently, the present invention reduces skew, wiring overhead, and time delay in an IC, and speedily and easily places and routes elements of the IC.

Figure 30A:
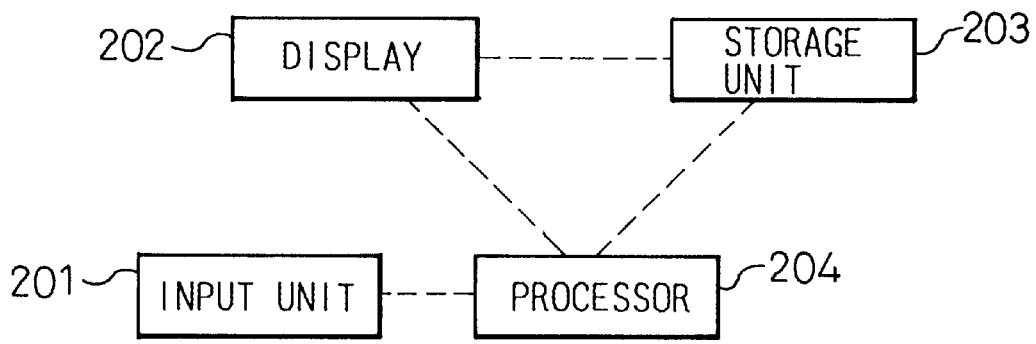
FIGS. 30A and 30B are general views showing a method of and an apparatus for placing and routing elements of a semiconductor IC according to the present invention.
Figure 30B:
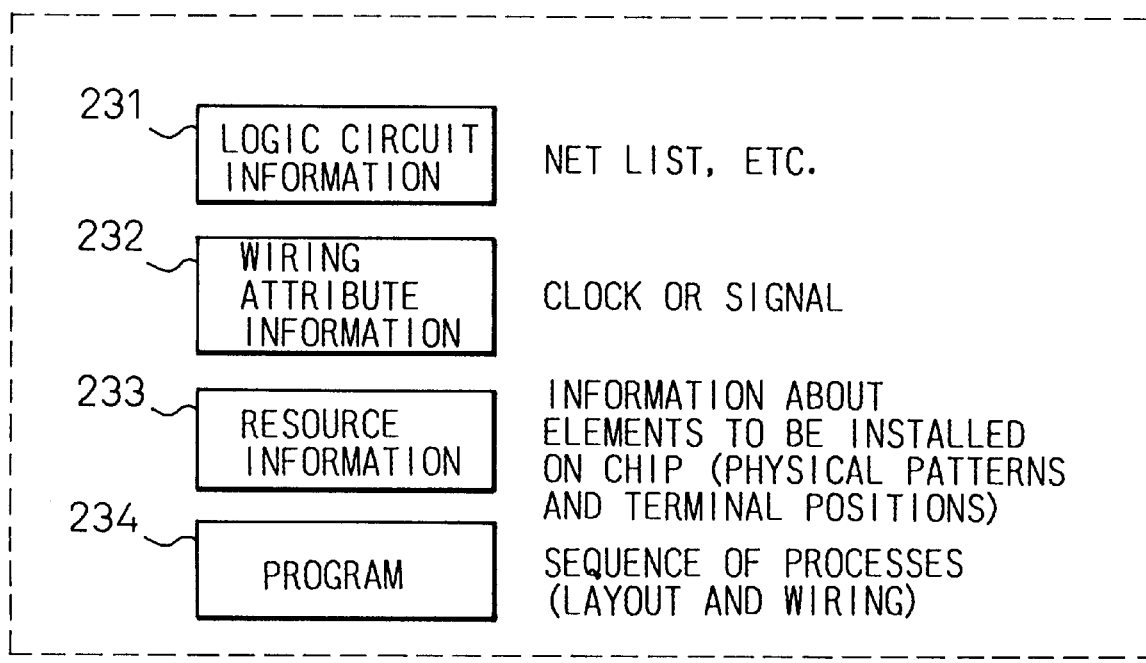

FIGS. 30A and 30B are block diagrams generally showing a CAD system employing the method of placing and routing elements of a semiconductor IC according to the present invention, in which FIG. 30A is a general view of the CAD system and FIG. 30B shows the functions of a storage unit of the CAD system.

In FIG. 30A, the CAD system includes an input unit 201, a display unit 202, a storage unit 203, and a processor 204. The input unit 201 includes a keyboard, a mouse, a tablet, etc., to be handled by an operator to place and route elements of a semiconductor IC. The display unit 202 displays various images as shown in FIGS. 3 to 5 and 14 to 18, so that the operator may interactively place and route the elements of the IC on the display unit 202. The processor 204 carries out processes according to instructions and data entered through the input unit 201 and information read out of the storage unit 203, and successively displays images on the display unit 202.

In FIG. 30B, the storage unit 203 stores logic circuit information 231 such as a net list, routing attribute information 232 for identifying clocks and signals, resource information 233 about chip elements such as physical patterns and terminals, and programs 234 indicating process sequences such as placing and routing sequences.

The present invention is applicable not only to clock signal nets but also to various nets that involve the problems of skew, wiring overhead, and delay.

As explained above in detail, the method of and apparatus for placing and routing elements of a semiconductor IC according to the present invention deal with a given signal net in a semiconductor IC, a driver of the net, and load cells driven by the driver. The present invention sets conditions on the signal net, driver, and load cells when placing and routing the elements of the IC, to thereby reduce skew, wiring overhead, and time delay in the IC and speedily and easily place and route the elements.

Many different embodiments of the present invention may be constructed without departing from the spirit and scope of the present invention, and it should be understood that the present invention is not limited to the specific embodiments described in this specification, except as defined in the appended claims.

What is claimed is:

1. A method of placing and routing elements of a semiconductor integrated circuit, comprising the steps of:
    picking out a signal net, a driver means of said signal net, and load cells driven by said driver means among the elements of said integrated circuit;
    placing said driver means at a first position, defining a first range based on said first position;
    fixing a second position in said first range;
    defining a second range based on said second position; and
    collectively placing and routing the load cells of predetermined number in said second range, said load cells being placed in a reserved area of predetermined size and along a reserved line of predetermined length, clock terminals of said load cells being positioned along said reserved line, so that the capacitance of a line from a branch point to any one of said load cells is determined by the length of said line.

2. A method of placing and routing elements of a semiconductor integrated circuit as claimed in claim 1, wherein said first range is the whole of a first area around said first position.

3. A method of placing and routing elements of a semiconductor integrated circuit as claimed in claim 1, wherein said first range is a range between a first area around said first position and a second area defined in said first area.

4. A method of placing and routing elements of a semiconductor integrated circuit as claimed in claim 1, wherein said method includes the steps of preparing a plurality of second positions and routing said first position to said plurality of second positions through star wiring.

5. A method of placing and routing elements of a semiconductor integrated circuit as claimed in claim 1, wherein said signal net is a clock signal net, said driver means is a clock driver, and said load cells are flip-flops.

6. A method of placing and routing elements of a semiconductor integrated circuit as claimed in claim 1, wherein said method includes the step of placing said load cells along said reserved line side by side such that short sides of each load cell are in parallel with said reserved line.

7. A method of placing and routing elements of a semiconductor integrated circuit as claimed in claim 1, wherein said method includes the step of placing said load cells like a spine with said reserved line serving as a base line.

8. A method of placing and routing elements of a semiconductor integrated circuit as claimed in claim 1, wherein said method includes the step of replacing load cells on the same reserved line with each other according to associations with respect to peripheral cells.

9. A method of placing and routing elements of a semiconductor integrated circuit as claimed in claim 1, wherein said method includes the step of replacing load cells on different reserved lines with each other according to associations with respect to peripheral cells.

10. A method of placing and routing elements of a semiconductor integrated circuit as claimed in claim 1, wherein said method includes the step of placing reserved lines in an area that satisfies a target skew with respect to a driver cell.

11. A method of placing and routing elements of a semiconductor integrated circuit as claimed in claim 10, wherein said method includes the step of connecting the reserved lines to said driver cell through star wiring with said driver cell serving as a root.

12. A method of placing and routing elements of a semiconductor integrated circuit as claimed in claim 10, wherein said method includes the step of connecting equipotential output terminals of said driver cell to said reserved lines, respectively.

13. An apparatus for placing and routing elements of a semiconductor integrated circuit, having an input unit for entering data, a storage unit for storing data, a processor for placing and routing the elements of said integrated circuit according to data from said input unit and said storage unit, and a display unit for displaying images according to data provided by said processor, wherein said apparatus comprises:
    a means for picking out a signal net, a driver of said signal net, and load cells connected to said driver among the elements of said integrated circuit;
    a means for placing said driver at a first position;
    a means for defining a first range based on said first position, fixing a second position in said first range, and defining a second range based on said second position; and
    a means for collectively placing and routing said load cells of predetermined number in said second range, said load cells being placed in a reserved area of predetermined size and along a reserved line of predetermined length, clock terminals of said load cells being positioned along said reserved line, so that the capacitance of a line from a branch point to any one of said load cells is determined by the length of said line.

14. An apparatus for placing and routing elements of a semiconductor integrated circuit as claimed in claim 13, wherein said storage unit comprises:
    a means for storing logic circuit information such as a net list;
    a means for storing routing attribute information to identify clocks and signals;
    a means for storing resource information such as information about the elements of said integrated circuit; and
    a means for storing programs such as sequences of processes.

15. An apparatus for placing and routing elements of a semiconductor integrated circuit as claimed in claim 13, wherein said first range is the whole of a first area around said first position.

16. An apparatus for placing and routing elements of a semiconductor integrated circuit as claimed in claim 13, wherein said first range is a range between a first area around said first position and a second area defined in said first area.

17. An apparatus for placing and routing elements of a semiconductor integrated circuit as claimed in claim 13, wherein a plurality of second positions are defined, and said first position is connected to said plurality of second positions through star wiring.

18. An apparatus for placing and routing elements of a semiconductor integrated circuit as claimed in claim 13, wherein said signal net is a clock signal net, and said load cells are flip-flops.

19. An apparatus for placing and routing elements of a semiconductor integrated circuit as claimed in claim 13, wherein said load cells are placed along said reserved line side by side such that short sides of each load cell are in parallel with said reserved line.

20. An apparatus for placing and routing elements of a semiconductor integrated circuit as claimed in claim 13, wherein said load cells are placed like a spine with said reserved line serving as a base line.

21. An apparatus for placing and routing elements of a semiconductor integrated circuit as claimed in claim 13, wherein load cells on the same reserved line are replaced with each other according to associations with respect to peripheral cells.

22. An apparatus for placing and routing elements of a semiconductor integrated circuit as claimed in claim 13, wherein load cells on different reserved lines are replaced with each other according to associations with respect to peripheral cells.

23. An apparatus for placing and routing elements of a semiconductor integrated circuit as claimed in claim 13, wherein reserved lines are placed in an area that satisfies a target skew with respect to said driver cell.

24. An apparatus for placing and routing elements of a semiconductor integrated circuit as claimed in claim 23, wherein said reserved lines are connected to said driver cell through star wiring with said driver cell serving as a root.

25. An apparatus for placing and routing elements of a semiconductor integrated circuit as claimed in claim 23, wherein said driver cell has output terminals of the same potential, which are connected to said reserved lines, respectively.

26. An apparatus as recited in claim 13, further comprising:
  a means for extending or shortening one of end lines when routing said signal net by operating said input unit; and
  a means for interactively extending or shortening the other end lines in response to the extension or shortening of said end lines.

27. An apparatus for placing and routing elements of a semiconductor integrated circuit as claimed in one of claim 26, wherein said storage unit comprises:
  a means for storing logic circuit information such as a net list;
  a means for storing routing attribute information to identify clocks and signals;
  a means for storing resource information such as information about the elements of said integrated circuits, and
  a means for storing programs such as sequences of processes.

28. An apparatus for placing and routing elements of a semiconductor integrated circuit as claimed in claim 26, wherein an arrival time at a predetermined position in said signal net is calculated, and said calculated arrival time is displayed in the vicinity of each predetermined position on a screen that displays said signal net.

* * * * *